(12) United States Patent
Huang et al.

(10) Patent No.: US 11,515,165 B2
(45) Date of Patent: Nov. 29, 2022

(54) SEMICONDUCTOR DEVICE AND METHOD

(71) Applicant: Taiwan Semiconductor Manufacturing Co., Ltd., Hsinchu (TW)

(72) Inventors: Yu-Lien Huang, Jhubei (TW); Guan-Ren Wang, Hsinchu (TW); Ching-Feng Fu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 72 days.

(21) Appl. No.: 16/898,655

(22) Filed: Jun. 11, 2020

(65) Prior Publication Data
US 2021/0391184 A1     Dec. 16, 2021

(51) Int. Cl.
| H01L 21/306 | (2006.01) |
| H01L 21/768 | (2006.01) |
| H01L 21/8234 | (2006.01) |
| H01L 27/088 | (2006.01) |
| H01L 29/66 | (2006.01) |
| H01L 29/78 | (2006.01) |

(52) U.S. Cl.
CPC .. *H01L 21/30608* (2013.01); *H01L 21/76829* (2013.01); *H01L 21/823431* (2013.01); *H01L 27/0886* (2013.01); *H01L 29/66795* (2013.01); *H01L 29/7851* (2013.01)

(58) Field of Classification Search
CPC ......... H01L 21/30608; H01L 21/76829; H01L 21/823431; H01L 27/0886; H01L 29/7851; H01L 29/7855; H01L 29/0603; H01L 29/0684; H01L 29/41783; H01L 21/823871; H01L 21/28518; H01L 21/76831; H01L 21/823814; H01L 21/823821; H01L 29/66795
See application file for complete search history.

(56) References Cited

U.S. PATENT DOCUMENTS

| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,522,368 B2 * | 12/2019 | Chao ............... H01L 29/785 |
| 10,566,246 B1 * | 2/2020 | Wu ................. H01L 21/02068 |
| 10,796,924 B2 * | 10/2020 | Chao ............... H01L 29/66795 |
| 10,854,716 B2 * | 12/2020 | Wang ............... H01L 21/76224 |

(Continued)

*Primary Examiner* — Bac H Au
(74) *Attorney, Agent, or Firm* — Slater Matsil, LLP

(57) ABSTRACT

In an embodiment, a structure includes: a contact etch stop layer (CESL) over a substrate; a fin extending through the CESL; an epitaxial source/drain region in the fin, the epitaxial source/drain region extending through the CESL; a silicide contacting upper facets of the epitaxial source/drain region; a source/drain contact contacting the silicide, lower facets of the epitaxial source/drain region, and a first surface of the CESL; and an inter-layer dielectric (ILD) layer surrounding the source/drain contact, the ILD layer contacting the first surface of the CESL.

20 Claims, 22 Drawing Sheets

(56) References Cited

U.S. PATENT DOCUMENTS

| | | | |
|---|---|---|---|
| 2014/0217517 A1* | 8/2014 | Cai | H01L 29/785 |
| | | | 438/586 |
| 2015/0200260 A1 | 7/2015 | Yu et al. | |
| 2015/0303118 A1* | 10/2015 | Wang | H01L 27/0886 |
| | | | 257/401 |
| 2016/0064483 A1 | 3/2016 | Kelly et al. | |
| 2016/0087053 A1* | 3/2016 | Kim | H01L 29/7848 |
| | | | 257/369 |
| 2016/0284806 A1* | 9/2016 | Park | H01L 29/0649 |
| 2016/0351570 A1* | 12/2016 | Park | H01L 21/3081 |
| 2017/0053916 A1* | 2/2017 | Ching | H01L 29/7848 |
| 2017/0125543 A1 | 5/2017 | Greene et al. | |
| 2017/0243760 A1 | 8/2017 | Chao et al. | |
| 2018/0151683 A1* | 5/2018 | Yeo | H01L 23/5226 |
| 2019/0097006 A1* | 3/2019 | Li | H01L 29/16 |
| 2019/0097051 A1* | 3/2019 | Tsai | H01L 29/66795 |
| 2019/0172752 A1* | 6/2019 | Hsu | H01L 21/31144 |
| 2019/0273023 A1* | 9/2019 | Loh | H01L 21/823425 |
| 2019/0312143 A1* | 10/2019 | Lin | H01L 21/26513 |
| 2019/0333820 A1* | 10/2019 | Chang | H01L 21/76843 |
| 2019/0348415 A1* | 11/2019 | Sung | H01L 29/785 |
| 2019/0371898 A1* | 12/2019 | Huang | H01L 21/30604 |
| 2020/0111714 A1 | 4/2020 | Lee et al. | |
| 2021/0408231 A1* | 12/2021 | Huang | H01L 21/823878 |

\* cited by examiner

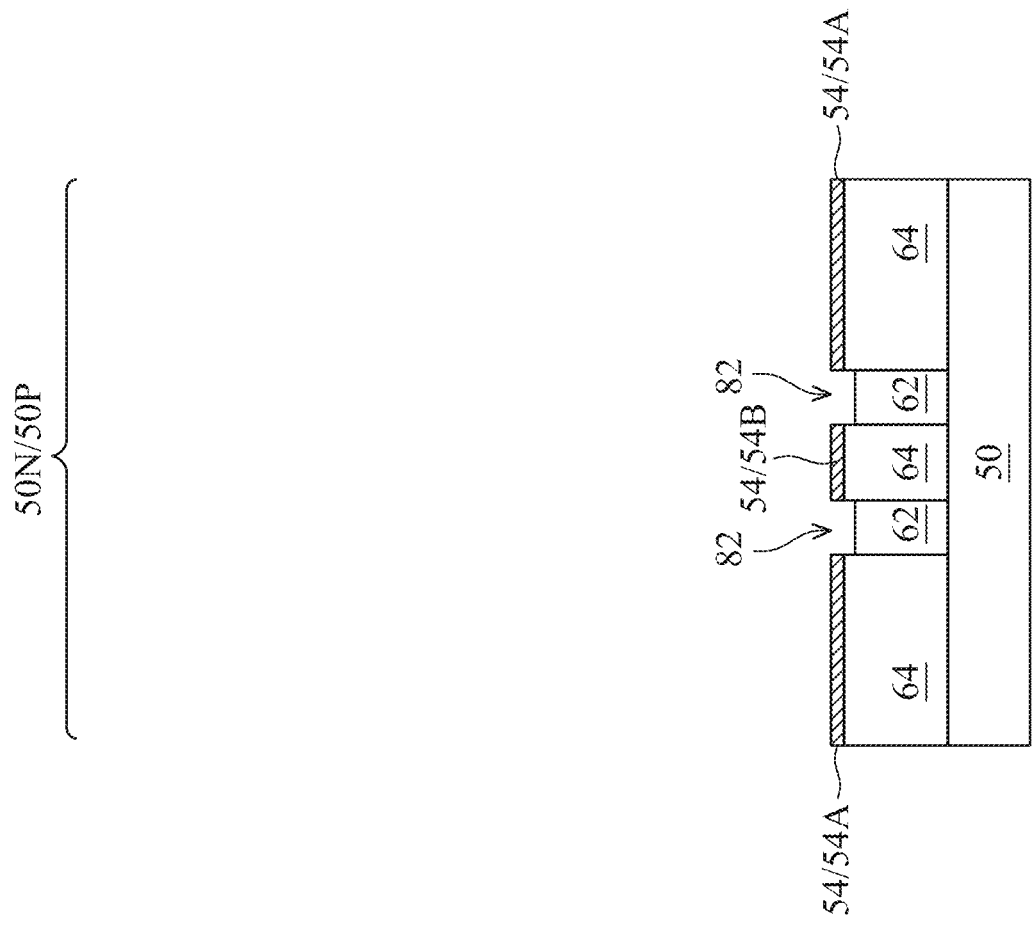
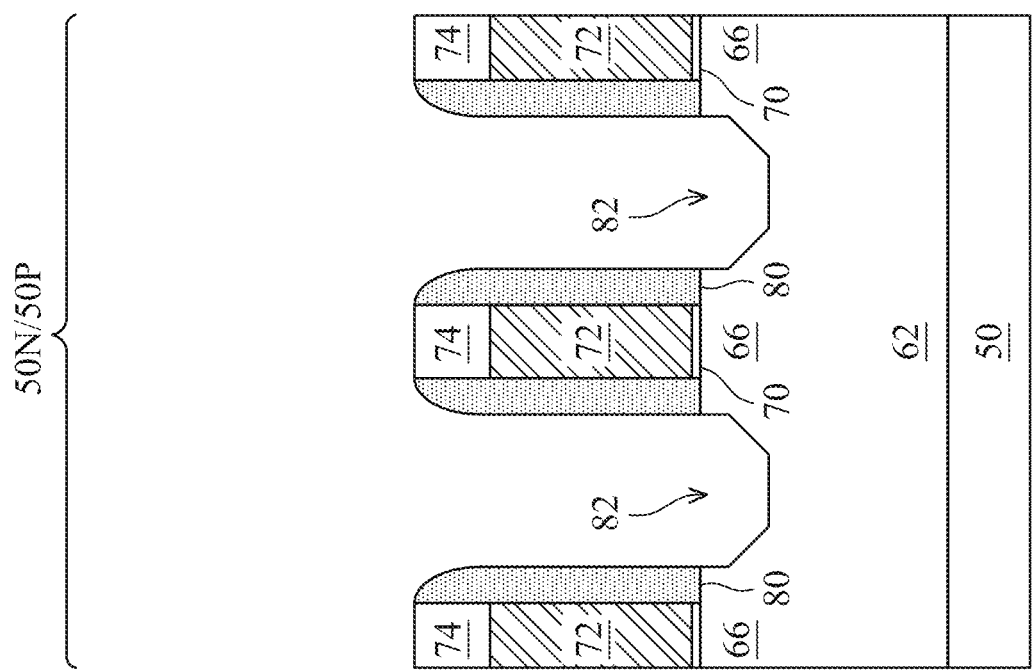
Figure 7A
Figure 7B

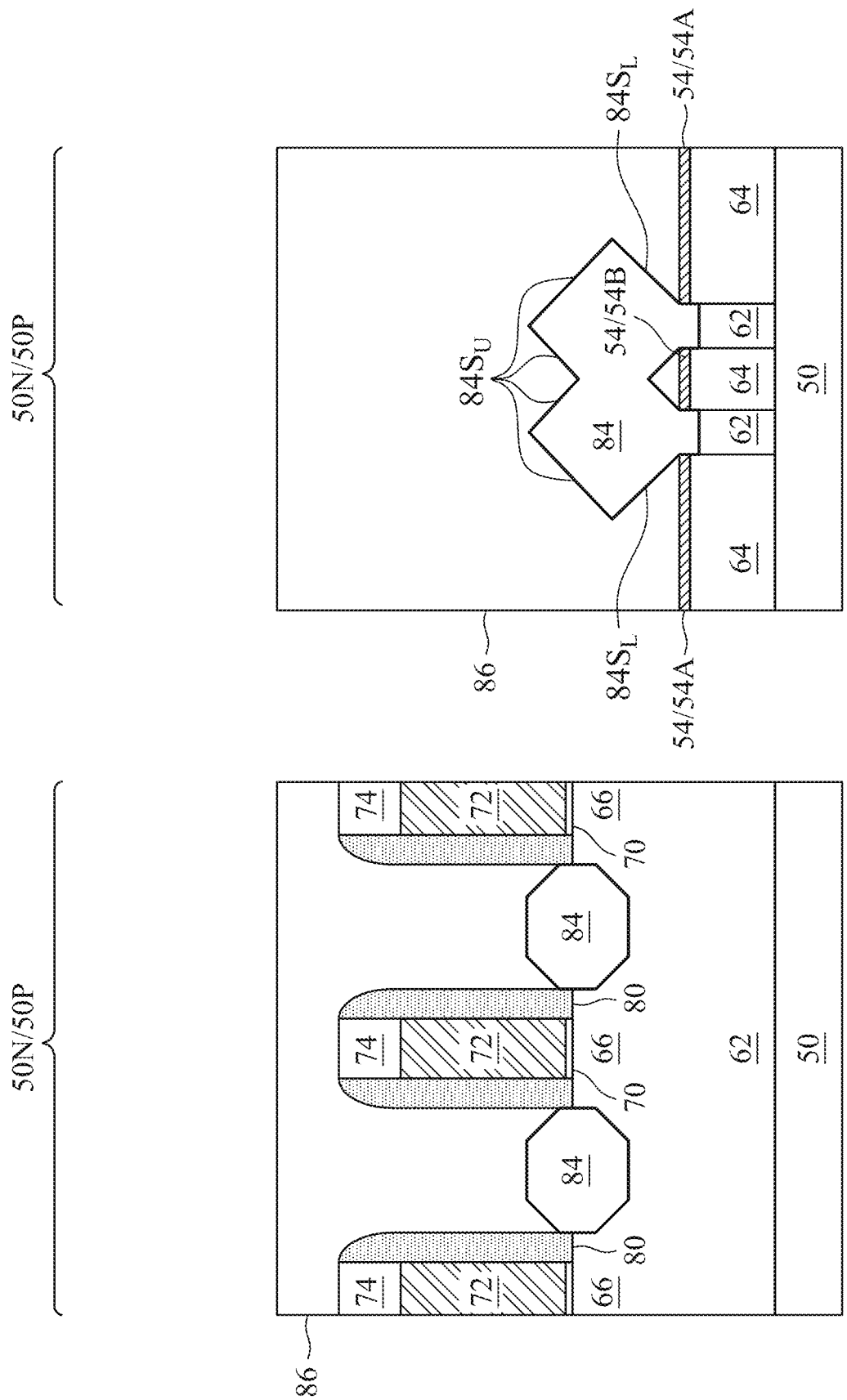

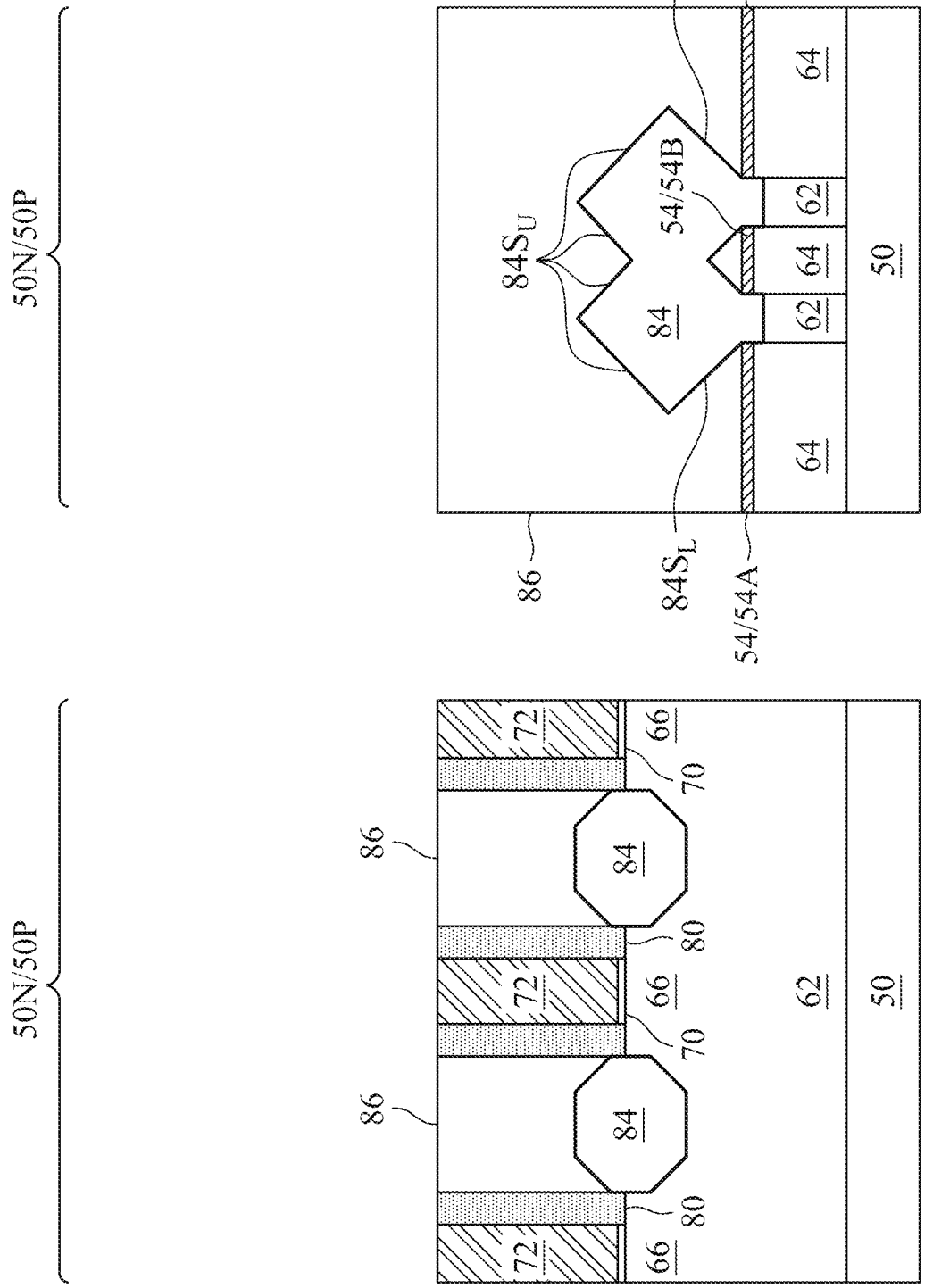

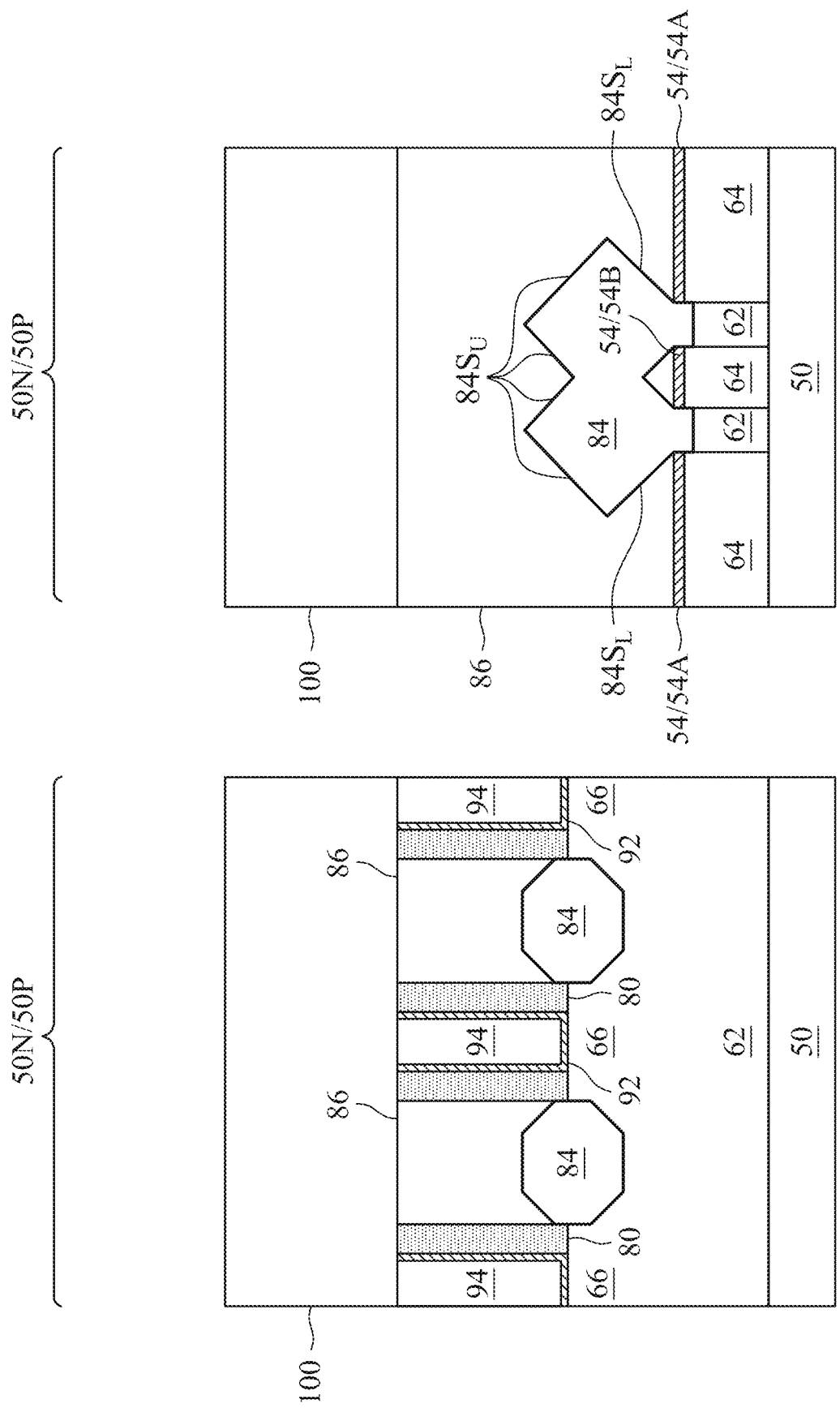

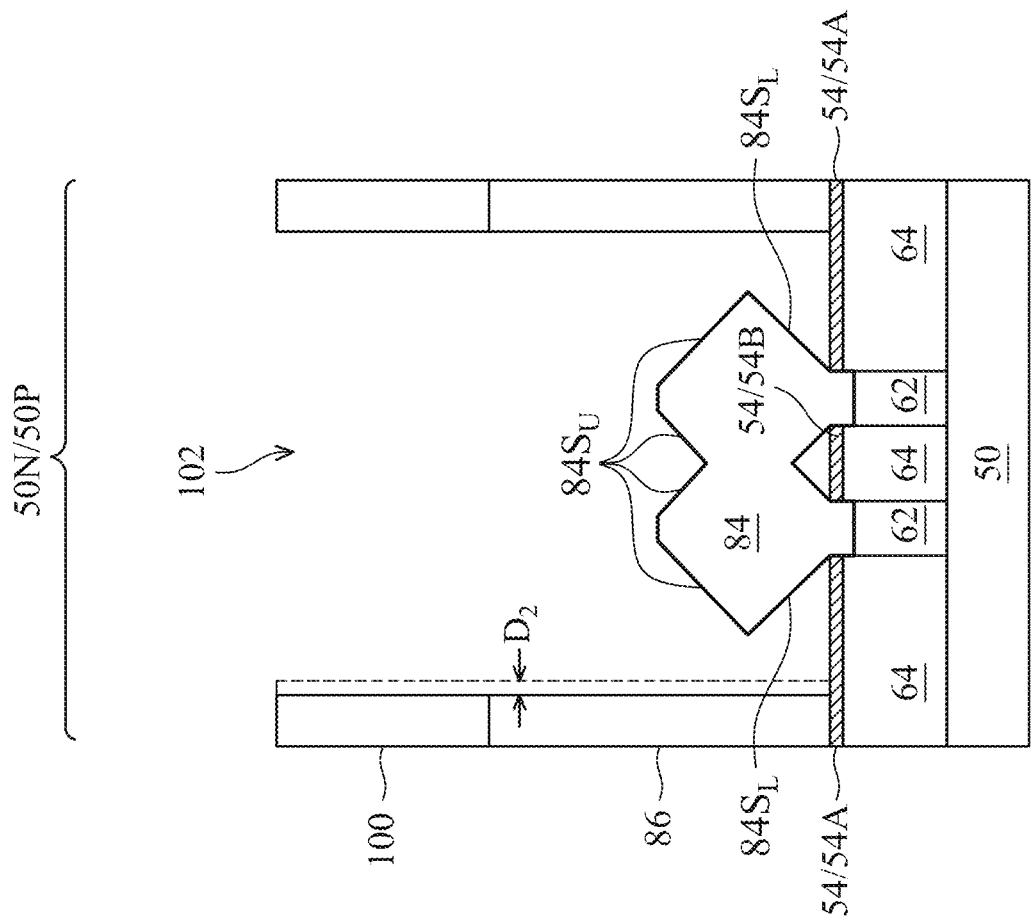
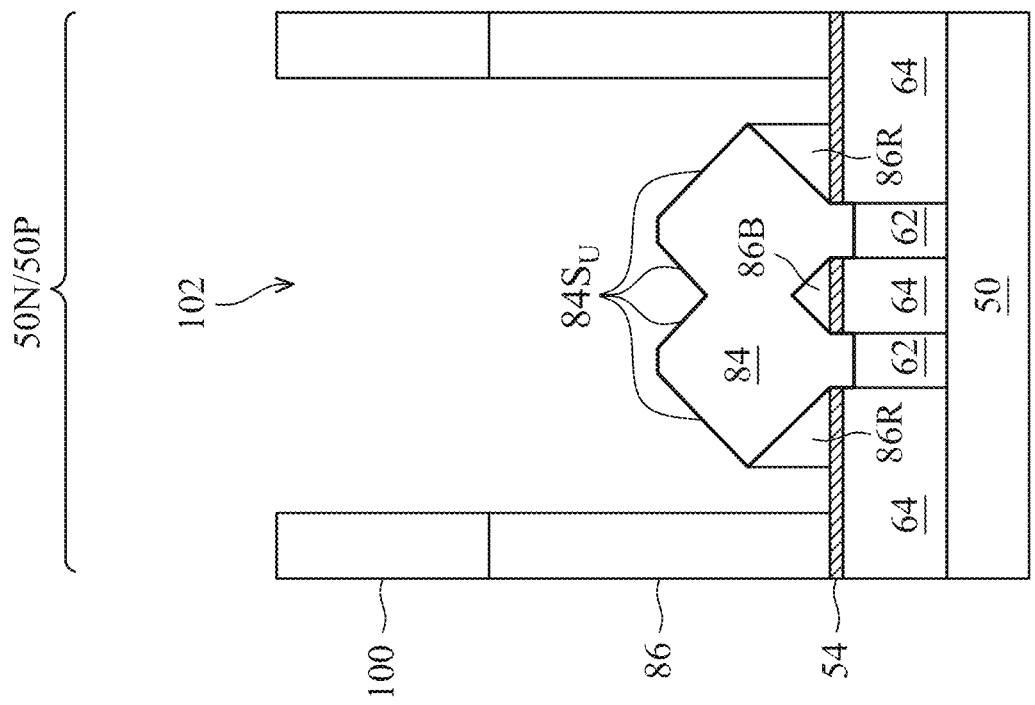
Figure 12C
Figure 12D

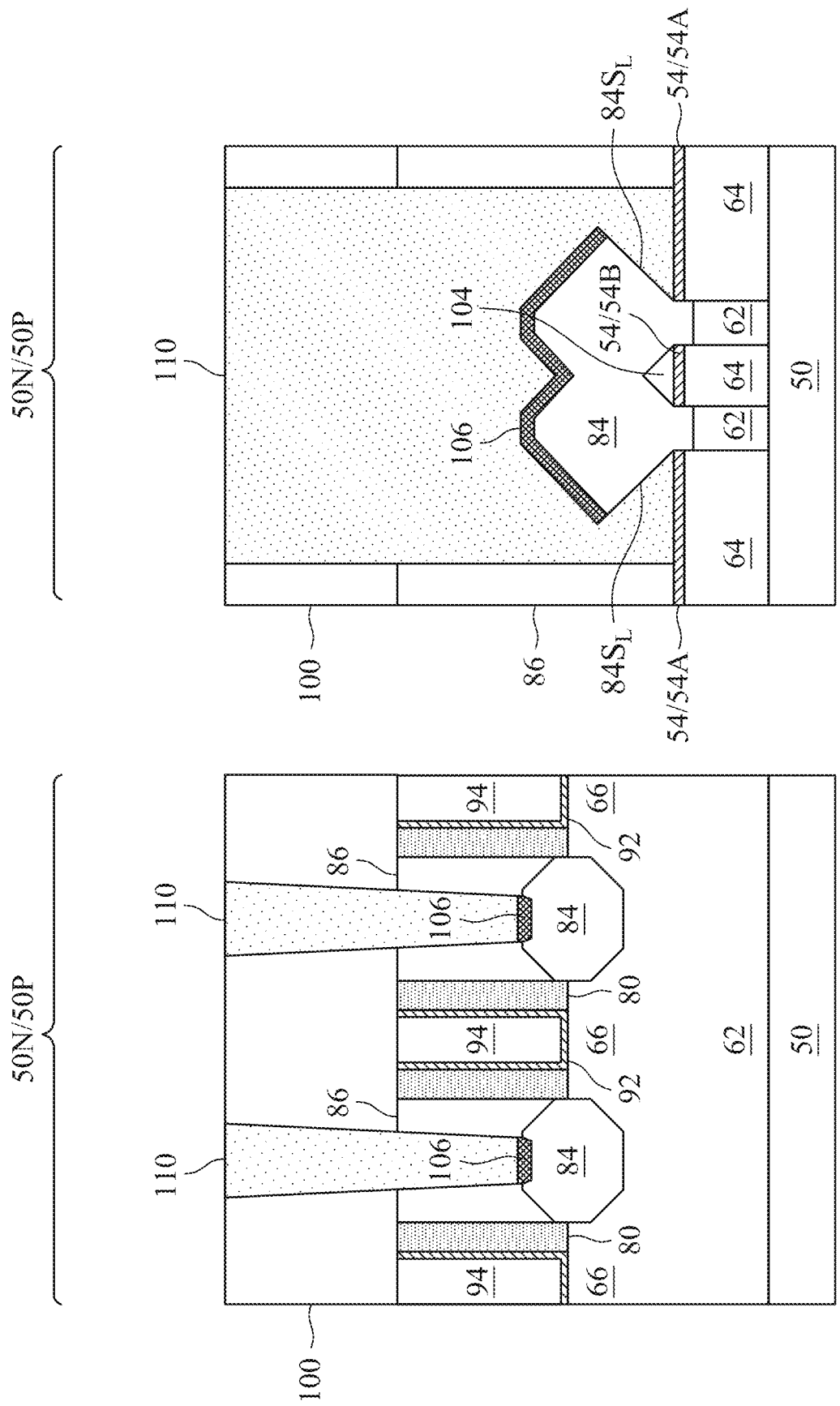

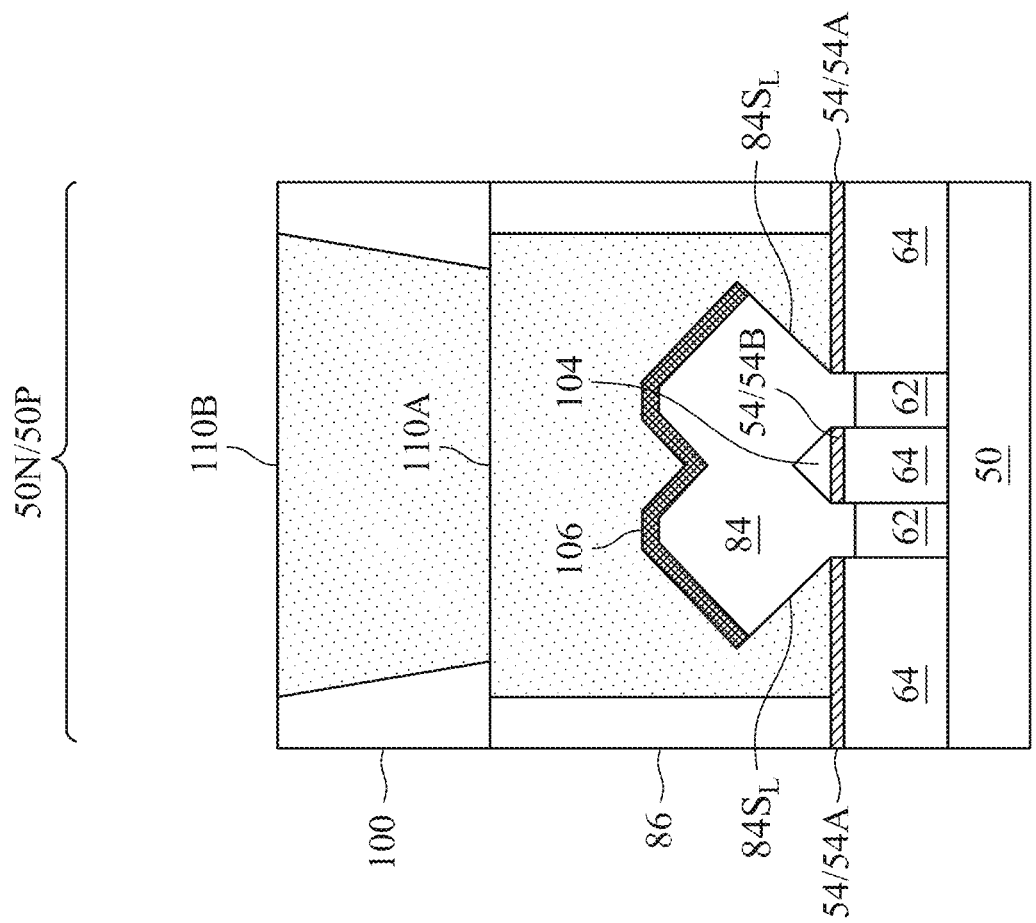
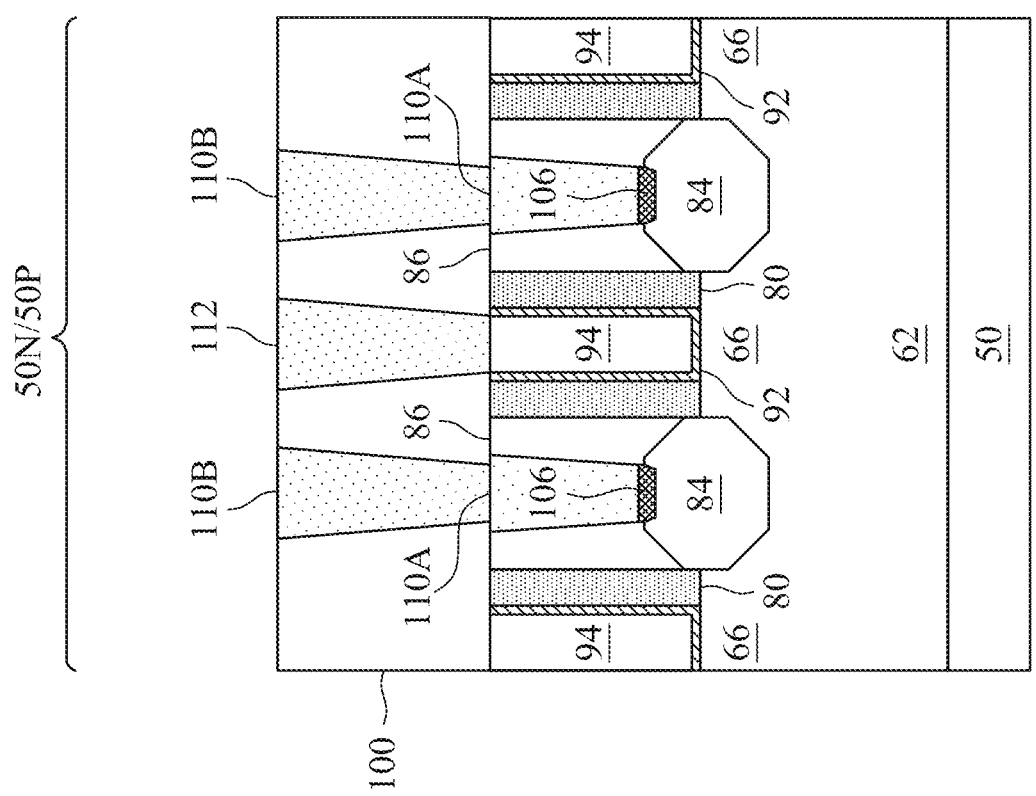

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, 8A, 8B, 9A, 9B, 10A, 10B, 11A, 11B, 12A, 12B, 12C, 12D, 13A, 13B, 14A, 14B, 15A, and 15B are cross-sectional views of further intermediate stages in the manufacturing of FinFETs, in accordance with some embodiments.

FIGS. 16A and 16B are cross-sectional views of FinFETs, in accordance with some other embodiments.

DETAILED DESCRIPTION

Figure 1:
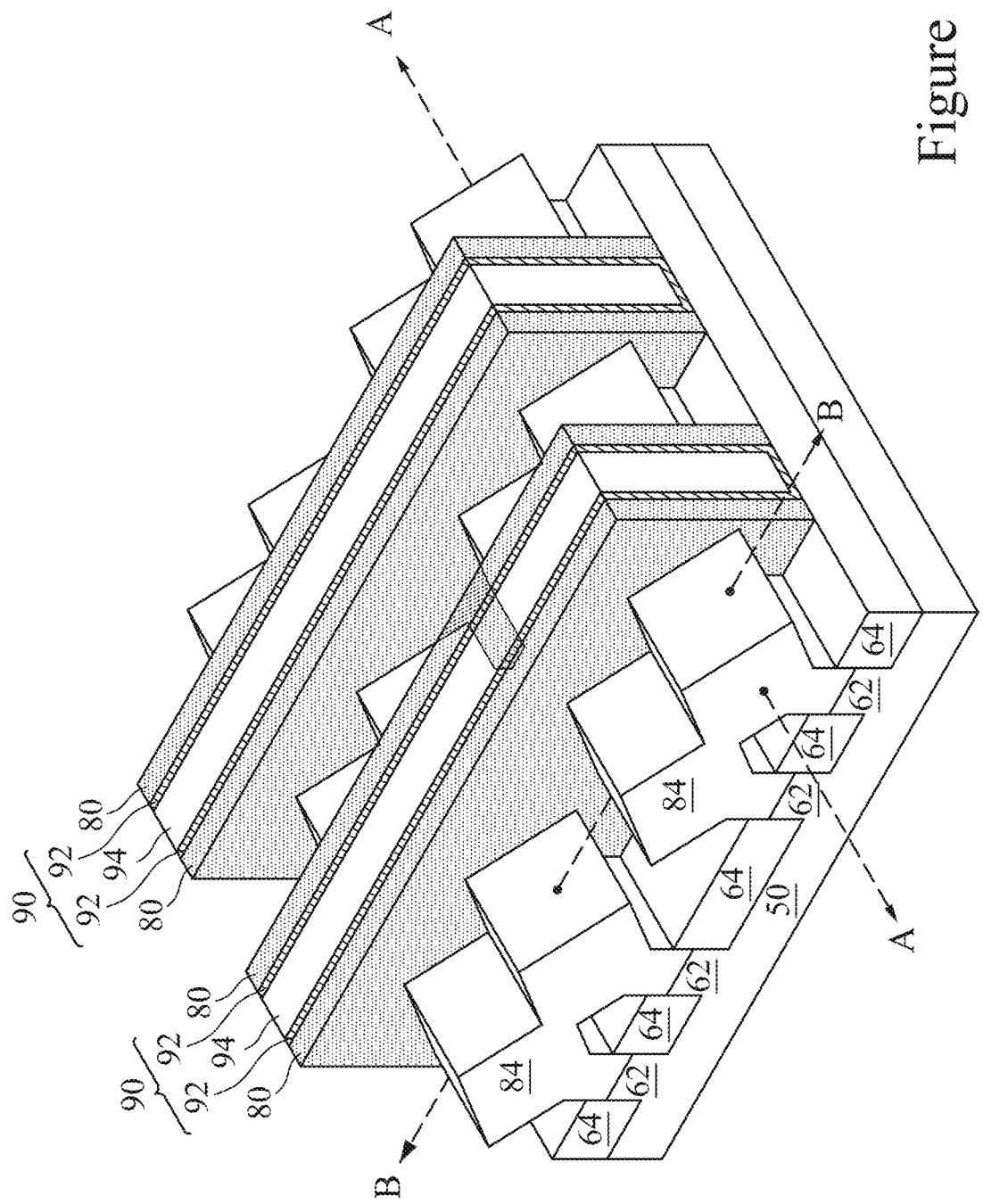
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a contact etch stop layer (CESL) is formed before epitaxial source/drain regions of a FinFET are formed. For example, the CESL can be deposited before the fins of the FinFET are formed in a fin-last process. Because the epitaxial source/drain regions are formed after the CESL, the CESL thus underlies the faceted surfaces of the epitaxial source/drain regions. During a subsequent contact formation process, overlying inter-layer dielectric (ILD) layer(s) may be over-etched to form contact openings without damaging the underlying shallow trench isolation (STI) regions. Over-etching the ILD layers during contact formation helps remove portions of the ILD layers beneath the epitaxial source/drain regions. Removing such portions of the ILD layers allows more surfaces of the epitaxial source/drain regions to be exposed, thereby increasing the surface area available for contacts that will be subsequently formed to the epitaxial source/drain regions.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically coupled in a manner to operate as, for example, one transistor or multiple transistors, such as four transistors.

The FinFETs include fins 62 extending from a substrate 50. STI regions 64 are disposed over the substrate 50, and the fins 62 protrude above and from between neighboring STI regions 64. Although the STI regions 64 are described/illustrated as being separate from the substrate 50, as used herein the term "substrate" may be used to refer to just the semiconductor substrate or a semiconductor substrate inclusive of isolation regions. Additionally, although the fins 62 are illustrated as being a single, continuous material of the substrate 50, the fins 62 and/or the substrate 50 may include a single material or a plurality of materials. In this context, the fins 62 refers to the portions extending between the neighboring STI regions 64.

Gate structures 90 are over channel regions of the fins 62. The gate structures 90 include gate dielectrics 92 and gate electrodes 94. The gate dielectrics 92 are along sidewalls and over top surfaces of the fins 62, and the gate electrodes 94 are over the gate dielectrics 92. Source/drain regions 84 are disposed in opposite sides of the fins 62 with respect to the gate dielectrics 92 and the gate electrodes 94. Gate spacers 80 separate the source/drain regions 84 from the gate structures 90. In embodiments where multiple transistors are formed, the source/drain regions 84 may be shared between various transistors. In embodiments where one transistor is formed from multiple fins 62, neighboring source/drain regions 84 may be electrically coupled, such as through coalescing the source/drain regions 84 by epitaxial growth, or through coupling the source/drain regions 84 with a same source/drain contact. One or more inter-layer dielectric (ILD) layer(s) (discussed further below) are over the source/drain regions 84 and/or the gate electrodes 94, through which contacts (discussed further below) to the source/drain regions 84 and the gate electrodes 94 are formed.

FIG. 1 further illustrates several reference cross-sections. Cross-section A-A is along a longitudinal axis of a fin 62 and in a direction of, for example, a current flow between the source/drain regions 84 of a FinFET. Cross-section B-B is perpendicular to cross-section A-A and extends through source/drain regions 84 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 6 are three-dimensional views of intermediate stages in the manufacturing of FinFETs, in accordance with some embodiments. FIGS. 2 through 6 show a similar three-dimensional view as FIG. 1, except three gate structures are shown.

Figure 2:
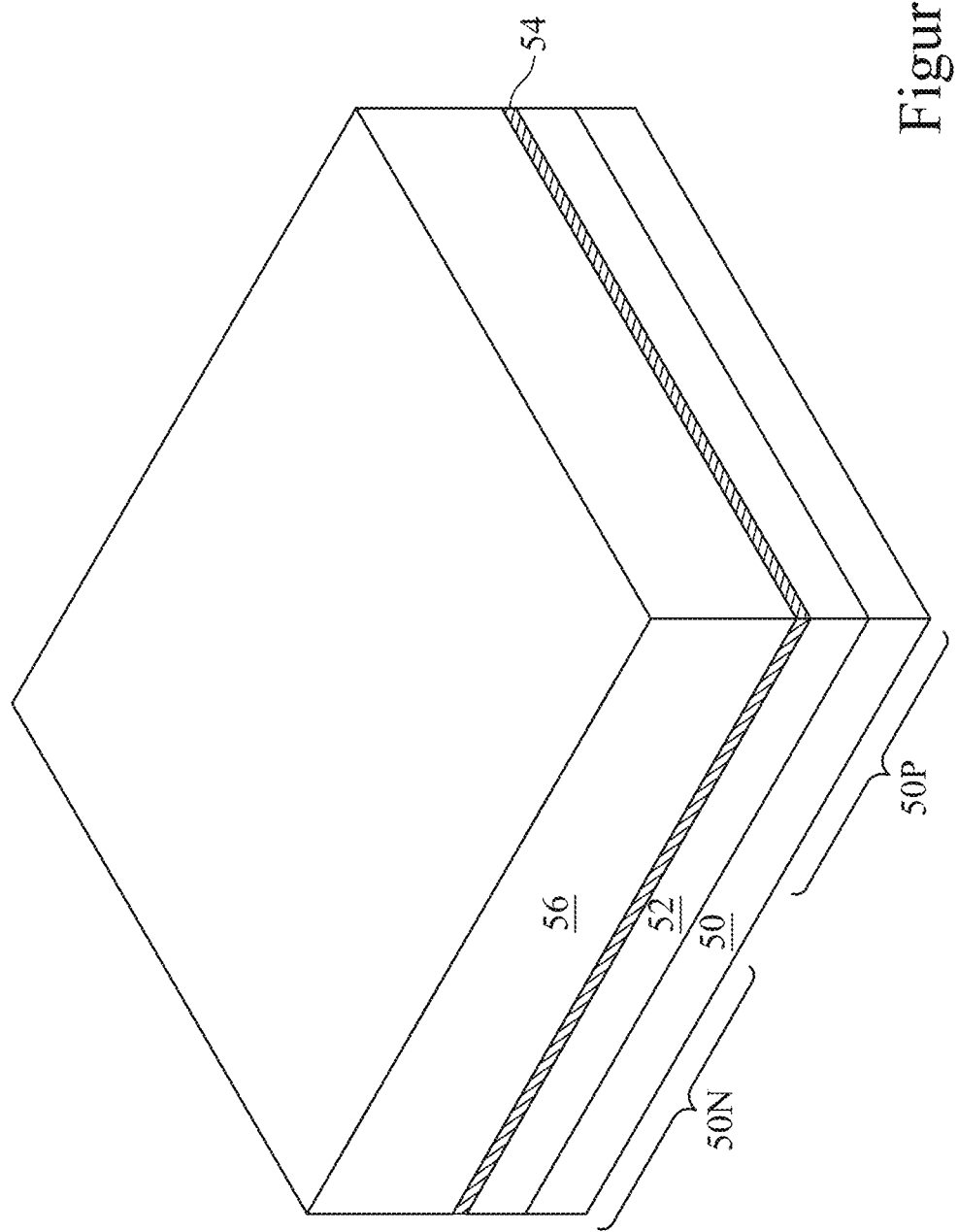
FIGS. 2, 3, 4, 5, and 6 are three-dimensional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

A dielectric layer 52 is then formed on the substrate 50. As discussed further below, the dielectric layer 52 will be patterned to form STI regions. The dielectric layer 52 may be formed of an oxide, such as silicon oxide, a nitride, such as silicon nitride, the like, or a combination thereof, and may be formed by chemical vapor deposition (CVD), high density plasma chemical vapor deposition (HDP-CVD), flowable CVD (FCVD) (e.g., a CVD-based material deposition in a remote plasma system and post curing to convert it to another material, such as an oxide), the like, or a combination thereof. Other insulation materials formed by any acceptable process may be used. In an embodiment, the dielectric layer 52 is a layer of silicon oxide formed by a FCVD process. Although the dielectric layer 52 is illustrated as a single layer, some embodiments may utilize multiple layers. For example, in some embodiments the dielectric layer 52 includes a liner sub-layer and a filler sub-layer. The liner sub-layer may first be formed along the top surface of the substrate 50, and the filler sub-layer may be formed over the liner. In some embodiments, the liner sub-layer is formed of a nitride, such as silicon nitride, and the filler sub-layer is formed of an oxide, such as silicon oxide.

A CESL 54 is then formed on the dielectric layer 52. The CESL 54 is formed of a dielectric material having a different etch rate than the material of a subsequently formed ILD layer (discussed further below with respect to FIGS. 12A through 12D). For example, the CESL 54 may be formed of silicon nitride, silicon oxide, silicon oxynitride, or the like, and may be deposited by CVD, atomic layer deposition (ALD), or the like. In an embodiment, the CESL 54 is formed of silicon nitride.

A dielectric layer 56 is then formed on the CESL 54. The dielectric layer 56 may be formed of a material selected from the group of candidate materials of the dielectric layer 52, and may be formed using a method selected from the group of candidate methods for forming the dielectric layer 52. The dielectric layers 52, 56 may be formed of the same material, or may include different materials. In an embodiment, the dielectric layer 56 is a layer of silicon oxide formed by a FCVD process.

One or more anneal process(es) are performed after forming the dielectric layer 52 and/or the dielectric layer 56. In some embodiments, a first anneal process is performed after depositing the dielectric layer 52 and a second anneal process is performed after depositing the dielectric layer 56. In some embodiments, a single anneal process is performed after depositing both of the dielectric layers 52, 56 and the CESL 54, and no anneal processes are performed between the depositing of the dielectric layer 52 and the depositing of the dielectric layer 56. The anneal process(es) densifies the dielectric layers 52, 56. The dielectric layer 56 can then be planarized. In some embodiments, a planarization process such as a chemical mechanical polish (CMP), an etchback process, combinations thereof, or the like may be utilized.

Figure 3:
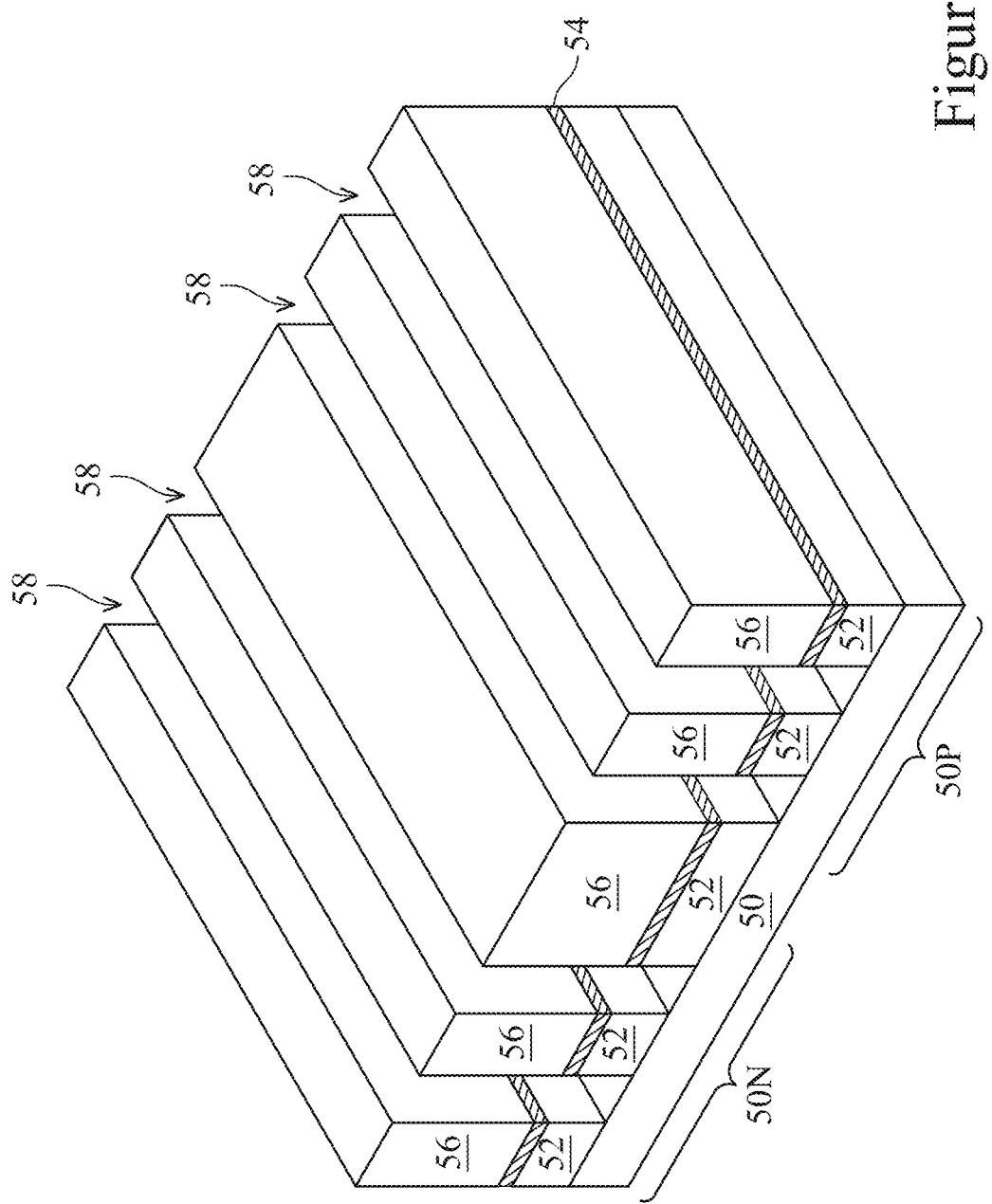

In FIG. 3, the dielectric layers 52, 56 and the CESL 54 are patterned to form trenches 58 exposing the substrate 50. The trenches 58 can be patterned using acceptable photolithography and etching techniques, such as with one or more etching process(es). The etching may be any acceptable etch process, such as a reactive ion etch (RIE) or the like. The etch may be anisotropic. In some embodiments, the etching is performed with a gas that can etch the material of both the dielectric layers 52, 56 (e.g., silicon oxide) and the material of the CESL 54 (e.g., silicon nitride), such as a fluorine-containing gas, such as tetrafluoromethane ($CF_4$), fluoroform ($CHF_3$), fluoromethane ($CH_3F$), octafluorocyclopentene ($C_5F_8$), octafluorocyclobutane ($C_4F_8$), combinations thereof, or the like. In some embodiments, the dielectric layers 52, 56 and the CESL 54 can each be patterned by a different etch.

Figure 4:
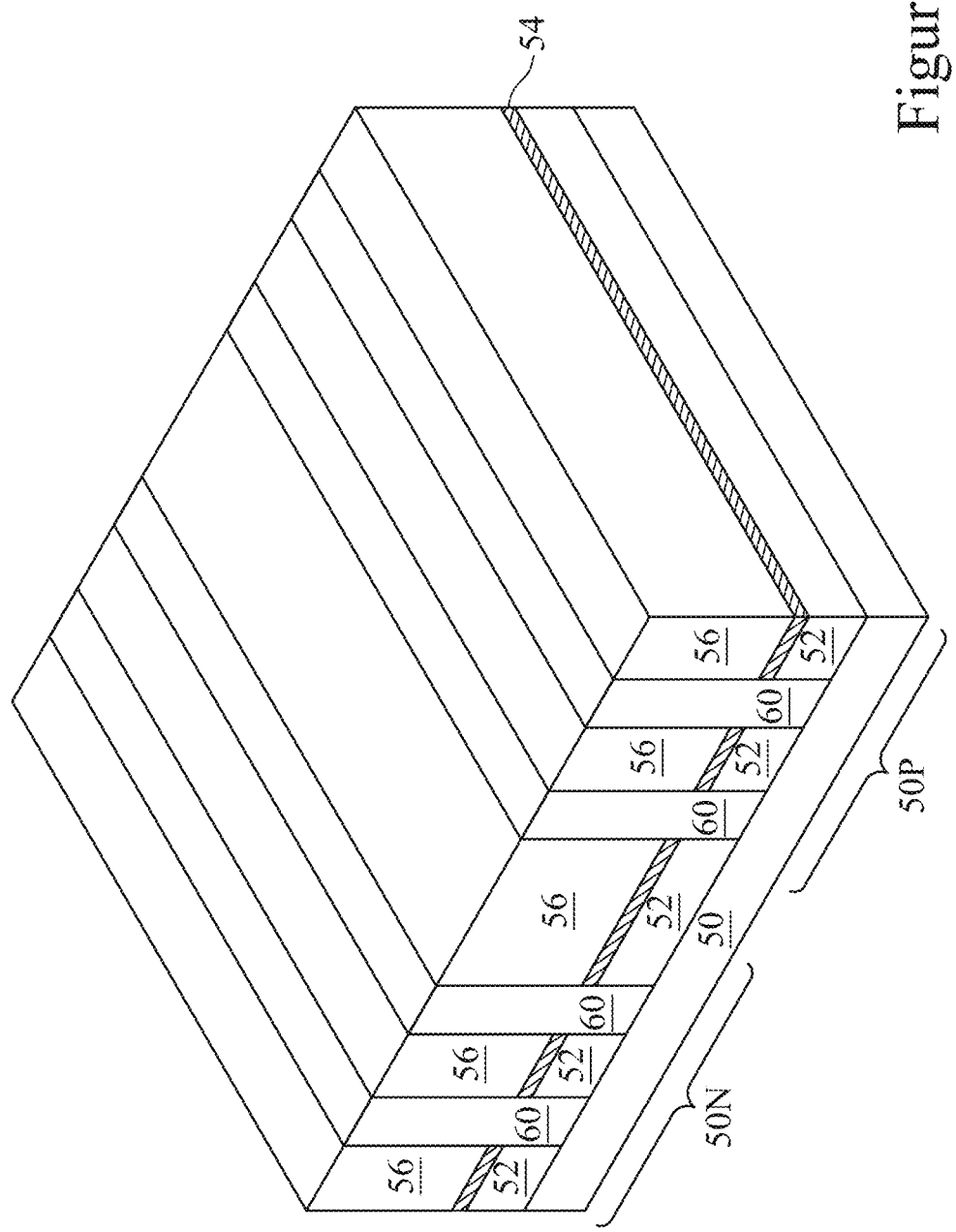

In FIG. 4, epitaxial structures 60 are formed in the trenches 58. The epitaxial structures 60 are formed of a semiconductor material. In some embodiments, the semiconductor material of the epitaxial structures 60 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. The epitaxial structures 60 may be formed of the same material as the substrate 50, or may include different materials than the substrate 50.

The epitaxial structures 60 are formed by an epitaxial growth process. For example, homoepitaxial structures can be epitaxially grown in the trenches 58. Additionally, in some embodiments, heteroepitaxial structures can be used for the epitaxial structures 60. For example, the epitaxial structures 60 can be recessed, and a material different from the epitaxial structures 60 may be epitaxially grown over the recessed epitaxial structures 60. In such embodiments, the final epitaxial structures 60 comprise the recessed material as well as the epitaxially grown material disposed over the recessed material. In an even further embodiment, heteroepitaxial structures can be epitaxially grown in the trenches 58 using a material different from the substrate 50. In some embodiments, the epitaxially grown materials may be in situ doped during growth, which may obviate prior and subsequent implantations, although in situ and implantation doping may be used together.

Still further, it may be advantageous to epitaxially grow a material in the region 50N (e.g., the NMOS region) different from the material in the region 50P (e.g., the PMOS region). In various embodiments, upper portions of the epitaxial structures 60 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming a III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Figure 5:
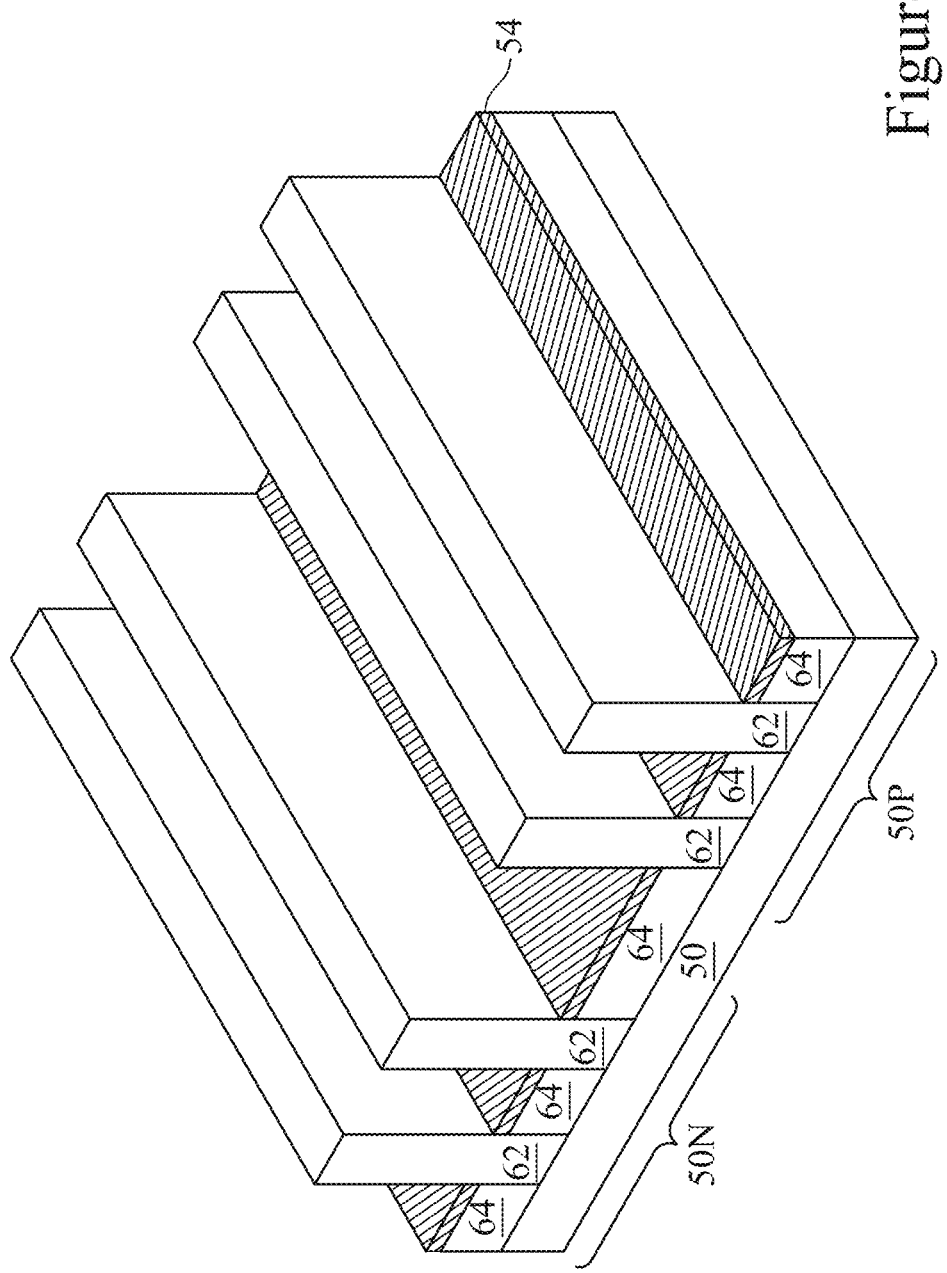

In FIG. 5, the dielectric layer 56 is removed. The dielectric layer 56 may be removed using an acceptable etching process, such as one that is selective to the material of the dielectric layer 56 (e.g., etches the material of the dielectric layer 56 at a faster rate than the material of the CESL 54 and the epitaxial structures 60). The etching process used to remove the dielectric layer 56 can be different from (e.g. is performed with different etching parameters, different etchants, and/or a different type of etching than) the etching process used to form the trenches 58. For example, an oxide removal using, for example, dilute hydrofluoric (dHF) acid may be used. The CESL 54 stops the oxide removal, thus protecting the dielectric layer 52. After the oxide removal, the remaining portions of the dielectric layer 52 form STI regions 64, and the epitaxial structures 60 (see FIG. 4) protrude from between neighboring portions of the STI regions 64 and neighboring portions of the CESL 54 to form fins 62. The fins 62 are semiconductor strips.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. For example, the spacers may be used to pattern the trenches 58, in which the fins 62 are formed.

Further, appropriate wells may be formed in the fins 62 and/or the substrate 50. In some embodiments, a P well may be formed in the region 50N, and an N well may be formed in the region 50P. In some embodiments, a P well or an N well are formed in both the region 50N and the region 50P.

In embodiments with different well types, the different implant steps for the region 50N and the region 50P may be achieved using a photoresist or other masks. For example, a photoresist may be formed over the fins 62 and the STI regions 64 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like, and can be implanted in the region to a concentration of equal to or less than $10^{18}$ $cm^{-3}$, such as in the range of about $10^{16}$ $cm^{-3}$ to about $10^{18}$ $cm^{-3}$. After the implant, the photoresist is removed, such as by an acceptable ashing process.

Following the implanting of the region 50P, a photoresist is formed over the fins 62 and the STI regions 64 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like, and can be implanted in the region to a concentration of equal to or less than $10^{18}$ $cm^{-3}$, such as in the range of about $10^{16}$ $Cm^{-3}$ to about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of the fins 62 may be in situ doped during growth, which may obviate the implantations, although in situ and implantation doping may be used together.

Figure 6:
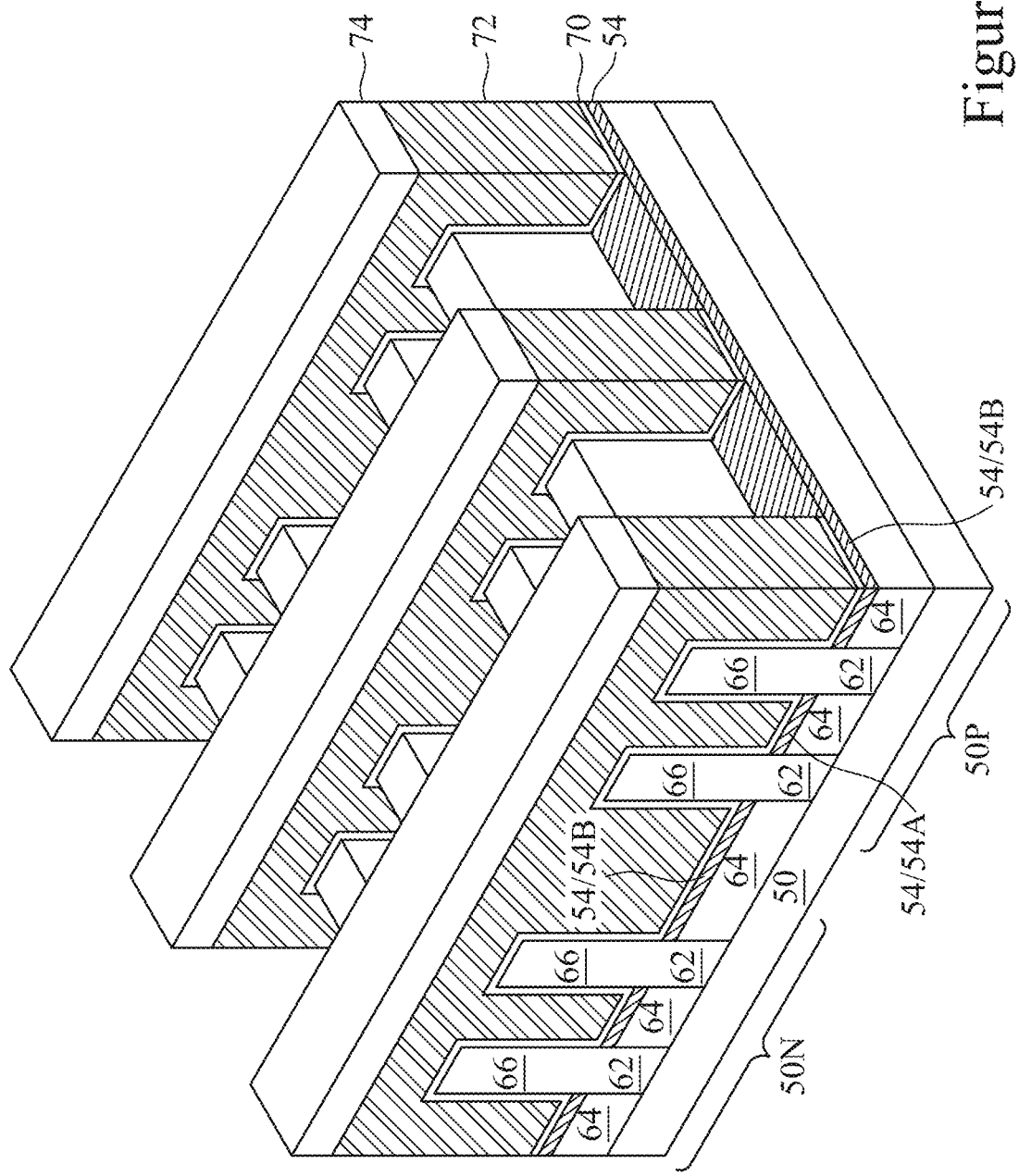

In FIG. 6, dummy dielectrics 70 are formed over the fins 62 and dummy gates 72 are formed over the dummy dielectrics 70. The dummy dielectrics 70 and dummy gates 72 may be collectively referred to as "dummy gate stacks," with each dummy gate stack including a dummy dielectric 70 and a dummy gate 72. The dummy gate stacks extend along sidewalls of the fins 62. The dummy dielectrics 70 may contact the CESL 54, including portions 54A of the CESL 54 between individual fins 62, and portions 54B of the CESL 54 between groups of the fins 62.

As an example to form the dummy dielectrics 70 and the dummy gates 72, a dummy dielectric layer is formed on the fins 62. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing the selected material. The dummy gate layer may be made of other materials that have a high etching selectivity from the etching of the CESL 54. The mask layer may include, for example, silicon nitride, silicon oxynitride, or the like. In this example, a single dummy gate layer and a single mask layer are formed across the region 50N and the region 50P. The mask layer is then patterned using acceptable photolithography and etching techniques to form masks 74. The pattern of the masks 74 is then transferred to the dummy gate layer by an acceptable etching technique to form the dummy gates 72. The pattern of the masks 74 may optionally be further transferred to the dummy dielectric layer to form the dummy dielectrics 70. The dummy gates 72 cover respective channel regions 66 of the fins 62. The pattern of the masks 74 may be used to physically separate each of the dummy gates 72 from adjacent dummy gates. The dummy gates 72 may also have a lengthwise direction substantially perpendicular (within process limitations) to the lengthwise direction of respective fins 62. Although the dummy dielectrics 70 are shown covering the CESL 54, it should be appreciate that the dummy dielectrics 70 can be formed in other manners. In some embodiments, such as when the dummy dielectric layer is thermally grown, the dummy dielectrics 70 are formed to only cover the fins 62.

FIGS. 7A through 15B are cross-sectional views of further intermediate stages in the manufacturing of FinFETs, in accordance with some embodiments. FIGS. 7A, 9A, 10A, 11A, 12A, 13A, 14A, and 15A are cross-sectional views illustrated along reference cross-section A-A in FIG. 1, except three gate structures are shown. FIGS. 7B, 9B, 10B, 11B, 12B, 12C, 12D, 13B, 14B, and 15B are cross-sectional views illustrated along reference cross-section B-B in FIG. 1, except only two fins are shown. FIGS. 7A through 15B illustrate features in either of the region 50N and the region 50P. For example, the structures illustrated in FIGS. 7A through 15B may be applicable to both the region 50N and the region 50P. Differences (if any) in the structures of the region 50N and the region 50P are described herein.

In FIGS. 7A and 7B, gate spacers 80 are formed on exposed surfaces of the dummy gates 72, the masks 74, and/or the fins 62. The gate spacers 80 may be formed by forming an insulating material and subsequently etching the insulating material. The insulating material of the gate spacers 80 may be silicon nitride, silicon carbonitride, silicon oxycarbonitride, a combination thereof, or the like, and may be formed by thermal oxidation, deposition, a combination thereof, or the like. In some embodiments, the gate spacers 80 are formed from a multi-layered insulating material, and include multiple layers. For example, the gate spacers 80 may include multiple layers of silicon carbonitride, may include multiple layers of silicon oxycarbonitride, or may include a layer of silicon oxide disposed between two layers of silicon nitride. The etching of the gate spacers 80 can be anisotropic, and is selective to the material of the gate spacer 80 (e.g., etches the material of the gate spacers 80 at a faster rate than the material of the CESL 54). After etching, the gate spacers 80 can have straight sidewalls or curved sidewalls.

Before or during the formation of the gate spacers 80, implants for lightly doped source/drain (LDD) regions (not explicitly illustrated) may be performed. In embodiments with different device types, similar to the implants discussed, a mask, such as a photoresist, may be formed over the region 50N, while exposing the region 50P, and appropriate type (e.g., p-type) impurities may be implanted into the exposed fins 62 in the region 50P. The mask may then be removed. Subsequently, a mask, such as a photoresist, may be formed over the region 50P while exposing the region 50N, and appropriate type impurities (e.g., n-type) may be implanted into the exposed fins 62 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Source/drain recesses 82 are then formed in the fins 62. The source/drain recesses 82 can be formed using acceptable photolithography and etching techniques. The source/drain recesses 82 can extend into portions of the fins 62 beneath the top surfaces of the CESL 54 and optionally beneath the top surfaces of the STI regions 64. As such, the source/drain recesses 82 extend through the CESL 54. Sidewalls of the CESL 54 and the STI regions 64 are thus exposed by the source/drain recesses 82.

In FIGS. 8A and 8B, epitaxial source/drain regions 84 are formed in the source/drain recesses 82. The epitaxial source/drain regions 84 are thus formed in the fins 62 such that each of the dummy gates 72 are disposed between respective neighboring pairs of the epitaxial source/drain regions 84. The epitaxial source/drain regions 84 thus extend through the CESL 54 and may extend into portions of the fins 62 beneath the top surfaces of the STI regions 64. In some embodiments, the gate spacers 80 are used to separate the epitaxial source/drain regions 84 from the dummy gates 72 by an appropriate lateral distance so that the epitaxial source/drain regions 84 do not short out subsequently formed gates of the resulting FinFETs. The epitaxial source/drain regions 84 can exert stress in the channel regions 66 of the fins 62, thereby improving performance.

The epitaxial source/drain regions 84 in the region 50N, e.g., the NMOS region, may be formed by masking the region 50P, e.g., the PMOS region. Then, the epitaxial source/drain regions 84 in the region 50N are epitaxially grown in the source/drain recesses 82 in the region 50N. The epitaxial source/drain regions 84 may include any acceptable material, such as appropriate for n-type FinFETs. For example, if the fins 62 are silicon, the epitaxial source/drain regions 84 in the region 50N may include materials exerting a tensile strain in the channel region 66, such as silicon, silicon carbide, phosphorous doped silicon carbide, silicon phosphide, or the like. The epitaxial source/drain regions 84 in the region 50N may have surfaces raised from respective surfaces of the fins 62 and may have facets.

The epitaxial source/drain regions 84 in the region 50P, e.g., the PMOS region, may be formed by masking the region 50N, e.g., the NMOS region. Then, the epitaxial source/drain regions 84 in the region 50P are epitaxially grown in the source/drain recesses 82 in the region 50P. The epitaxial source/drain regions 84 may include any acceptable material, such as appropriate for p-type FinFETs. For example, if the fins 62 are silicon, the epitaxial source/drain regions 84 in the region 50P may comprise materials exerting a compressive strain in the channel region 66, such as silicon-germanium, boron doped silicon-germanium, germanium, germanium tin, or the like. The epitaxial source/drain regions 84 in the region 50P may also have surfaces raised from respective surfaces of the fins 62 and may have facets.

The epitaxial source/drain regions 84 and/or the fins 62 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 84 may be in situ doped during growth.

As a result of the epitaxy processes used to form the epitaxial source/drain regions 84, upper surfaces of the epitaxial source/drain regions 84 have facets $84S_U$, $84S_L$ which are raised (e.g., expand laterally outward) beyond sidewalls of the fins 62. Because the epitaxial source/drain regions 84 are formed after the CESL 54, the CESL 54 thus underlies the raised portions of the epitaxial source/drain regions 84, and does not extend along the facets $84S_U$, $84S_L$ of the epitaxial source/drain regions 84. Thus, the facets $84S_U$, $84S_L$ of the epitaxial source/drain regions 84 are free from the CESL 54. In some embodiments, the facets $84S_U$, $84S_L$ cause adjacent epitaxial source/drain regions 84 of a same FinFET to merge as illustrated. For example, merged epitaxial source/drain regions 84 may be formed when one transistor is formed from multiple fins 62. As such, the portions 54B of the CESL 54 are disposed between the fins 62 of a transistor, and the epitaxial source/drain regions 84 overly the portions 54B of the CESL 54. In other embodiments (discussed further below with respect to FIGS. 17A and 17B), adjacent epitaxial source/drain regions 84 remain separated after the epitaxy process is completed. For example, unmerged epitaxial source/drain regions 84 may be formed when one transistor is formed from a single fin 62. In the embodiment illustrated, the spacer etch used to form the gate spacers 80 is used to remove the spacer material to allow the epitaxial source/drain regions 84 to extend to the top surface of the CESL 54. In some other embodiments, the gate spacers 80 are formed covering a portion of the sidewalls of the fins 62 that extend above the CESL 54, thereby blocking the epitaxial growth.

It is noted that the above disclosure generally describes a process of forming spacers, LDD regions, and source/drain regions. Other processes and sequences may be used. For example, fewer or additional spacers may be utilized, different sequence of steps may be utilized, spacers may be formed and removed, and/or the like. In some embodiments, the gate spacers 80 are formed after the epitaxial source/drain regions 84. Furthermore, the n-type and p-type devices may be formed using a different structures and steps. In some embodiments, dummy spacers can be formed in the region 50N, and the source/drain recesses 82 in the region 50N can be formed through the dummy spacers and the CESL 54. The epitaxial source/drain regions 84 in the region 50N are then grown in the source/drain recesses 82. The dummy spacers in the region 50N can then be removed. Dummy spacers can then be formed in the region 50P, and the source/drain recesses 82 in the region 50P can be formed through the dummy spacers and the CESL 54. The epitaxial source/drain regions 84 in the region 50P are then grown in the source/drain recesses 82. The dummy spacers in the region 50P can then be removed. The gate spacers 80 can be formed after the epitaxial source/drain regions 84 have been formed in both the region 50N and the region 50P.

A first ILD layer 86 is then deposited over the epitaxial source/drain regions 84, the gate spacers 80, the masks 74 (if present) or the dummy gates 72, and the STI regions 64. The first ILD layer 86 is formed of a dielectric material having a different etch rate than the material of the CESL 54, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials formed by any acceptable process may be used. After formation, the first ILD layer 86 can be planarized, such as by a CMP. Because the epitaxial source/drain regions 84 are formed after the CESL 54, the first ILD layer 86 physically contacts the facets $84S_U$, $84S_L$ of the epitaxial source/drain regions 84, with no etch stop layers disposed between the first ILD layer 86 and the epitaxial source/drain regions 84. Further, the first ILD layer 86 physically contacts the portions 54A of the CESL 54, and can also be formed beneath the epitaxial source/drain regions 84 to physically contact the portions 54B of the CESL 54.

In FIGS. 9A and 9B, a planarization process, such as a CMP, may be performed to level the top surface of the first ILD layer 86 with the top surfaces of the masks 74 (if present) or the dummy gates 72. The planarization process can remove the masks 74 on the dummy gates 72 and portions of the gate spacers 80 along sidewalls of the masks 74. After the planarization process, top surfaces of the dummy gates 72, the gate spacers 80, and the first ILD layer 86 are coplanar. Accordingly, the top surfaces of the dummy gates 72 are exposed through the first ILD layer 86. In some embodiments, the masks 74 may remain, in which case the planarization process levels the top surface of the first ILD layer 86 with the top surfaces of the masks 74.

Figures 10A, 10B:
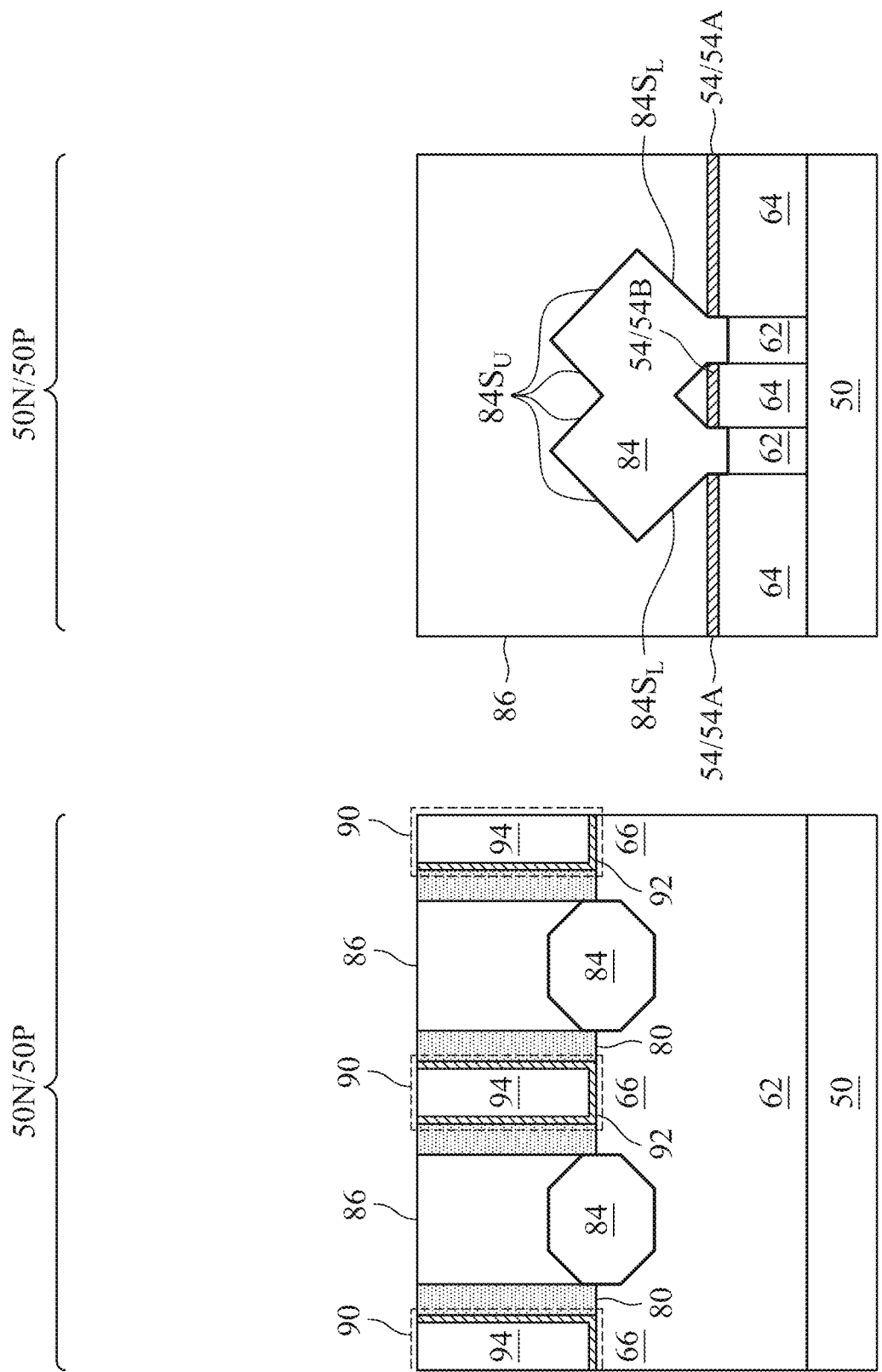

In FIGS. 10A and 10B, the dummy gates 72 and optionally the dummy dielectrics 70 are removed and are replaced with gate structures 90. The gate structures 90 include gate dielectrics 92 and gate electrodes 94. As an example to form the gate structures 90, the dummy gates 72 and the masks 74 (if present) are removed in one or more etching step(s), so that recesses are formed. Portions of the dummy dielectrics 70 in the recesses may also be removed. In some embodiments, only the dummy gates 72 are removed and the dummy dielectrics 70 remain and are exposed by the recesses. In some embodiments, the dummy dielectrics 70 are removed from recesses in a first region of a die (e.g., a core logic region) and remain in recesses in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD layer 86 or the gate spacers 80. Each recess exposes and/or overlies a channel region 66 of a respective fin 62. Each channel region 66 is disposed between neighboring pairs of the epitaxial source/drain regions 84. During the removal, the dummy dielectrics 70 may be used as etch stop layers when the dummy gates 72 are etched. The dummy dielectrics 70 may then be optionally removed after the removal of the dummy gates 72. After the removal, the gate dielectrics 92 are deposited conformally in the recesses, such as on the top surfaces and the sidewalls of the fins 62 and on sidewalls of the gate spacers 80. The gate dielectrics 92 may also be formed on top surface of the first ILD layer 86. In accordance with some embodiments, the gate dielectrics 92 comprise silicon oxide, silicon nitride, or multilayers thereof. In some embodiments, the gate dielectrics 92 include a high-k dielectric material, and in these embodiments, the gate dielectrics 92 may have a k value greater than about 7.0, and may include a metal oxide or a silicate of hafnium, aluminum, zirconium, lanthanum, manganese, barium, titanium, lead, and combinations thereof. The formation methods of the gate dielectrics 92 may include molecular-beam deposition (MBD), atomic layer deposition (ALD), PECVD, and the like. In embodiments where portions of the dummy dielectrics 70 remain in the recesses, the gate dielectrics 92 include a material of the dummy dielectrics 70 (e.g., silicon oxide). The gate electrodes 94 are deposited over the gate dielectrics 92, respectively, and fill the remaining portions of the recesses. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single-layer gate electrode 94 is illustrated, each gate electrode 94 may comprise any number of liner layers, any number of work function tuning layers, and a fill material. After the filling of the gate electrodes 94, a planarization process, such as a CMP, may be performed to remove the excess portions of the gate dielectrics 92 and the material of the gate electrodes 94, which excess portions are over the top surface of the first ILD layer 86. The remaining portions of material of the gate electrodes 94 and the gate dielectrics 92 form the gate structures 90 of the resulting FinFETs. The gate structures 90 may be also referred to as "gate stacks" or "metal gates." The gate structures 90 may extend along sidewalls of the channel regions 66 of the fins 62.

The formation of the gate structures 90 in the region 50N and the region 50P may occur simultaneously such that the gate dielectrics 92 in each region are formed from the same materials and the gate electrodes 94 in each region are formed from the same materials. In some embodiments, the gate structures 90 in each region may be formed by distinct processes, such that the gate dielectrics 92 in each region may be different materials and/or the gate electrodes 94 in each region may be different materials. Various masking steps may be used to mask and expose appropriate regions when using distinct processes.

In FIGS. 11A and 11B, a second ILD layer 100 is deposited over the first ILD layer 86. The second ILD layer 100 may be formed of a dielectric material, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. After formation, the second ILD layer 100 can be planarized, such as by a CMP. In some embodiments, an etch stop layer is formed between the first ILD layer 86 and the second ILD layer 100. The etch stop layer may comprise a dielectric material, such as silicon nitride, silicon oxide, silicon oxynitride, or the like, having a different etch rate than the material of the second ILD layer 100. In some embodiments, before the formation of the second ILD layer 100, gate masks can be formed over the gate dielectrics 92 and gate electrodes 94, which may protect the gate dielectrics 92 and gate electrodes 94 during contact formation.

Figures 12A, 12B:
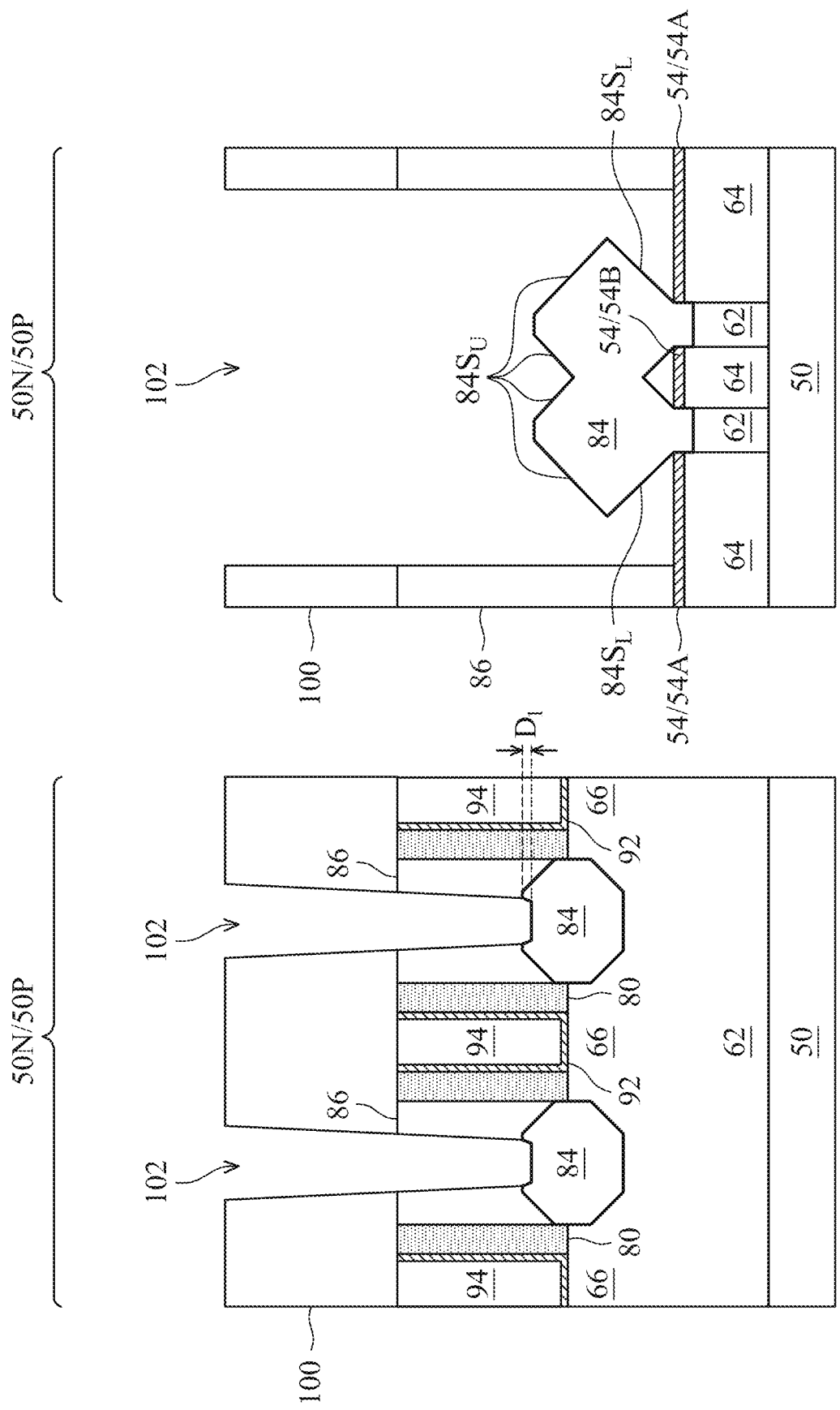

In FIGS. 12A and 12B, source/drain contact openings 102 are formed through the ILD layers 86, 100. The source/drain contact openings 102 may be formed using acceptable photolithography and etching techniques. The etching is selective to the material of the ILD layers 86, 100 (e.g., etches the material of the ILD layers 86, 100 at a faster rate than the material of the CESL 54). The CESL 54 stops the etching of the source/drain contact openings 102. Because the CESL 54 underlies the raised portions of the epitaxial source/drain regions 84, the facets $84S_U$, $84S_L$ of the epitaxial source/drain regions 84 can be exposed by aggressively etching (e.g., over-etching) the ILD layers 86, 100, without damaging the STI regions 64. Specifically, the first ILD layer 86 can be etched until the source/drain contact openings 102 extend completely through the first ILD layer 86 and expose the CESL 54 and all of the facets $84S_U$, $84S_L$ of the epitaxial source/drain regions 84 above the CESL 54. Exposing all of the facets $84S_U$, $84S_L$ of the epitaxial source/drain regions 84 increases the surface area available for contacts that will be subsequently formed to the epitaxial source/drain regions 84.

The etching process for forming the source/drain contact openings 102 may include a wet etch, a dry etch, or combinations thereof. Specifically, the etching process includes multiple etching steps, at least one of which has a greater degree of isotropy than the others. For example, the etching process for forming the source/drain contact openings 102 can include a first etch followed by a second etch, where the second etch has a greater degree of isotropy than the first etch, and where both etches are selective to the material of the ILD layers 86, 100. Performing an isotropic etching step helps remove portions of the first ILD layer 86 that are beneath the epitaxial source/drain regions 84, thus exposing the lower facets $84S_L$ of the epitaxial source/drain regions 84. The lower facets $84S_L$ of the epitaxial source/drain regions 84 are free from the CESL 54 after etching. FIGS. 12C and 12D are cross-sectional views of intermediate stages in the etching of the source/drain contact openings 102, in accordance with some embodiments. FIGS. 12C and 12D show a similar cross-section as FIG. 12B.

In FIG. 12C, the anisotropic etch is performed to initially form the source/drain contact openings 102 through the ILD layers 86, 100 and expose the CESL 54 and the upper facets $84S_U$ of the epitaxial source/drain regions 84. The anisotropic etch removes some of the first ILD layer 86 on the CESL 54. Some portions 86R, 86B of the first ILD layer 86 remain covering portions of the CESL 54 and the lower facets $84S_L$ of the epitaxial source/drain regions 84 after the anisotropic etch.

In FIG. 12D, the isotropic etch is then performed to expand the source/drain contact openings 102 and remove the portions 86R, 86B of the first ILD layer 86 beneath the epitaxial source/drain regions 84, thus exposing more of the CESL 54 and the lower facets $84S_L$ of the epitaxial source/drain regions 84. The portions 54B of the CESL 54 are thus exposed. As noted above, the ILD layers 86, 100 are over-etched. Over-etching can be accomplished by continuously performing the isotropic etch for a long duration (discussed further below). Etching for a long duration helps expose all of the facets $84S_U$, $84S_L$ of the epitaxial source/drain regions 84 above the CESL 54. Further, over-etching can widen the source/drain contact openings 102. For example, the widths of the source/drain contact openings 102 can be increased by a distance $D_2$, which can be from about 5% to about 50% of the original widths of the source/drain contact openings 102. In some embodiments, the distance $D_2$ can be from about 1 nm to about 6 nm.

Widening the source/drain contact openings 102 can help avoid the formation of seams or voids in the subsequently formed contacts by avoiding pinch-off effects. Even further, over-etching can change the profile shape of the source/drain contact openings 102. Specifically, the sidewalls of the source/drain contact openings 102 can become slanted or more slanted by over-etching. For example, the sidewalls of the source/drain contact openings 102 each form a first angle with a plane parallel to the major surface of the substrate 50 before etching, and the sidewalls of the source/drain contact openings 102 each form a second angle with the plane parallel to the major surface of the substrate 50 after etching, with the first angle being different from the second angle.

It should be appreciated that, even when over-etching is performed, some of the portions 86R, 86B of the first ILD layer 86 may remain beneath the epitaxial source/drain regions 84. For example, trace amounts of the material of the first ILD layer 86 may remain beneath the epitaxial source/drain regions 84 after the etching. However, in such embodiments, the quantity of exposed facets 84SU, 84SL of the epitaxial source/drain regions 84 may still be increased, thus increasing the surface area available for the subsequently formed contacts.

In some embodiments, when the ILD layers 86, 100 are formed of an oxide, (e.g., silicon oxide) and the CESL 54 is formed of a nitride (e.g., silicon nitride), selective anisotropic etching of the ILD layers 86, 100 can be performed by a dry etch, such as a reactive ion etch (RIE), and selective isotropic etching of the ILD layers 86, 100 can be performed by a wet etch, such as an oxide etch. The dry etch can be performed using one or more reaction gas(es) such as tetrafluoromethane ($CF_4$), hexafluoro-1,3-butadiene ($C_4F_6$), octafluorocyclobutane ($C_4F_8$), octafluorocyclopentene ($C_5F_8$), the like, or combinations thereof, while generating a plasma with $H_2$, $O_2$, $CO_2$, CO, or the like. The plasma be generated with an inductively coupled plasma (ICP) generator, a capacitively coupled plasma (CCP) generator, a remote plasma generator, or the like. A bias voltage can be applied between the plasma generator and the chuck supporting the substrate 50 to bombard the ILD layers 86, 100 with ions. The wet etch can be performed using dilute hydrofluoric (dHF) acid, or a chemical oxide etch such as CERTAS (hydrogen fluoride (HF) and ammonia ($NH_3$)), SiCONi (nitrogen trifluoride ($NF_3$) and ammonia ($NH_3$)), or the like. As noted above, the ILD layers 86, 100 are over-etched. Over-etching can be accomplished by continuously performing the wet etch for a long duration, such as a duration in the range of about 5 seconds to about 60 seconds.

In some embodiments, when the ILD layers 86, 100 are formed of an oxide, (e.g., silicon oxide) and the CESL 54 is formed of a nitride (e.g., silicon nitride), selective anisotropic etching of the ILD layers 86, 100 can be performed by a first dry etch, such as a reactive ion etch (RIE), and selective isotropic etching of the ILD layers 86, 100 can also be performed by a second dry etch, such as a reactive ion etch (RIE). The first dry etch can be performed using one or more reaction gas(es) such as tetrafluoromethane ($CF_4$), hexafluoro-1,3-butadiene ($C_4F_6$), octafluorocyclobutane ($C_4F_8$), octafluorocyclopentene ($C_5F_8$), the like, or combinations thereof, while generating a plasma with $H_2$, $O_2$, $CO_2$, CO, or the like. The plasma be generated with an inductively coupled plasma (ICP) generator, a capacitively coupled plasma (CCP) generator, a remote plasma generator, or the like. A bias voltage can be applied between the plasma generator and the chuck supporting the substrate 50 to bombard the ILD layers 86, 100 with ions. The second dry etch can be performed using similar reaction gas(es) and with a similar plasma generation as the first dry etch, but can be performed at a greater pressure and/or with a lower bias voltage than the first dry etch. For example, the pressure during the second dry etch can be from about 200% to about 30000% greater than the pressure during the first dry etch, and the bias voltage during the second dry etch can be from about 2% to about 50% less than the bias voltage during the first dry etch. More specifically, the first dry etch can be performed at a pressure in the range of about 3 mTorr to about 30 mTorr and with an applied bias voltages in the range of about 100 volts to about 500 volts, while the second dry etch can be performed at a pressure in the range of about 60 mTorr to about 900 mTorr and with an applied bias voltages in the range of about 10 volts to about 50 volts. Performing the second dry etch at a greater pressure and/or with a lower bias voltage than the first dry etch allows the second dry etch to have a greater degree of isotropy than the first dry etch. As noted above, the ILD layers 86, 100 are over-etched. Over-etching can be accomplished by continuously performing the second dry etch for a long duration, such as a duration in the range of about 5 seconds to about 60 seconds.

After the source/drain contact openings 102 are formed, the etched portions of the epitaxial source/drain regions 84 can have reduced heights. The heights of the epitaxial source/drain regions 84 can be reduced by one or more of the etching processes used to form the source/drain contact openings 102. For example, the heights of the epitaxial source/drain regions 84 can be reduced by a distance $D_1$, which can be from about 2% to about 20% of the original heights of the epitaxial source/drain regions 84. In some embodiments, the distance $D_1$ can be from about 1 nm to about 10 nm.

Figures 13A, 13B:
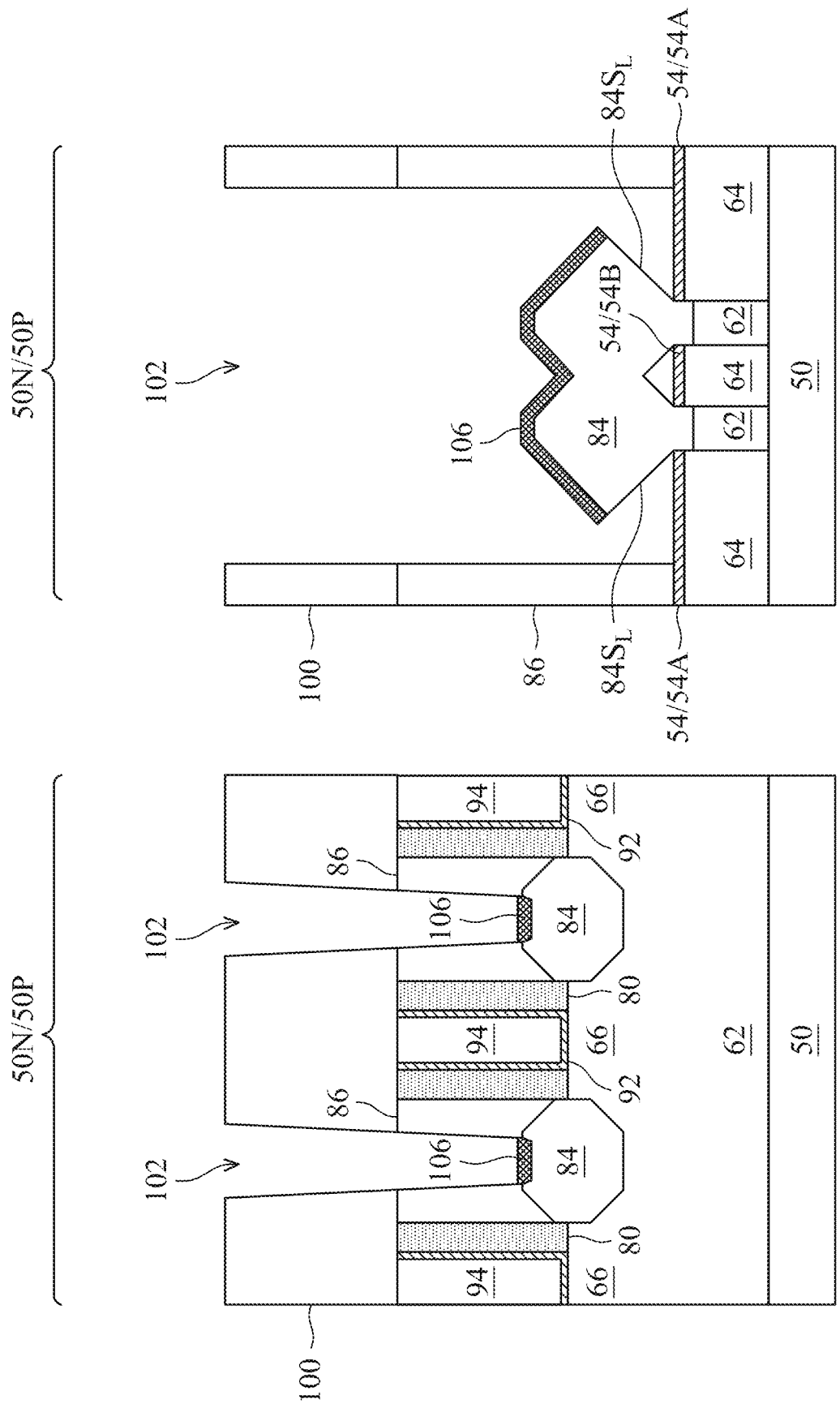

In FIGS. 13A and 13B, metal-semiconductor alloy regions 106 are formed in the source/drain contact openings 102, such as on portions of the epitaxial source/drain regions 84 exposed by the source/drain contact openings 102. The metal-semiconductor alloy regions 106 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 106 can be formed by depositing a metal in the source/drain contact openings 102 and then performing a thermal anneal process. The metal can be any metal capable of reacting with the semiconductor materials (e.g., silicon, silicon germanium, germanium, etc.) of the epitaxial source/drain regions 84 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. In an embodiment, the metal-semiconductor alloy regions 106 are silicide regions formed of titanium-silicon. After the thermal anneal process, a cleaning process, such as a wet clean, may be performed to remove any residual metal from the source/drain contact openings 102.

In the embodiment illustrated, the metal for the metal-semiconductor alloy regions 106 is deposited by a line-of-sight deposition process, such as PVD, and thus the metal-semiconductor alloy regions 106 are formed on the upper facets $84S_U$ (see FIG. 12B) of the epitaxial source/drain regions 84, with the lower facets $84S_L$ of the epitaxial source/drain regions 84 being free from the metal-semiconductor alloy regions 106. In another embodiment (discussed further below with respect to FIGS. 21A and 21B), the metal for the metal-semiconductor alloy regions 106 is deposited by a blanket deposition process, such as CVD or ALD, and thus the metal-semiconductor alloy regions 106 are formed on the upper facets $84S_U$ and the lower facets $84S_L$ of the epitaxial source/drain regions 84. The metal-semiconductor alloy regions 106 are physically and electrically coupled to the epitaxial source/drain regions 84.

In FIGS. 14A and 14B, source/drain contacts 110 are formed in the source/drain contact openings 102. A liner, such as a diffusion barrier layer, an adhesion layer, or the like, and a conductive material are formed in the source/drain contact openings 102, on the metal-semiconductor alloy regions 106. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 100. The remaining liner and conductive material form the source/drain contacts 110 in the source/drain contact openings 102. The source/drain contacts 110 are physically and electrically coupled to the metal-semiconductor alloy regions 106, and thus are connected to the epitaxial source/drain regions 84.

After formation, the source/drain contacts 110 extend through the ILD layers 86, 100. The source/drain contacts 110 can fill the portions of the source/drain contact openings 102 unoccupied by the metal-semiconductor alloy regions 106. The source/drain contacts 110 extend along and contact the lower facets $84S_L$ of the epitaxial source/drain regions 84, such as a subset of the lower facets $84S_L$ exposed by the source/drain contact openings 102. In embodiments where the metal-semiconductor alloy regions 106 are only formed on the upper facets $84S_U$ (see FIG. 12B) of the epitaxial source/drain regions 84, the source/drain contacts 110 contact the lower facets $84S_L$ of the epitaxial source/drain regions 84. The source/drain contacts 110 and the first ILD layer 86 also contact the portions 54A of the CESL 54, but not the portions 54B of the CESL 54. Because the CESL 54 underlies the raised portions of the epitaxial source/drain regions 84, all of the interfaces of the CESL 54 and the source/drain contacts 110 are planar to a major surface of the substrate 50, and the CESL 54 does not extend along the facets $84S_U$, $84S_L$ of the epitaxial source/drain regions 84. In fact, no intervening layers besides the metal-semiconductor alloy regions 106 are disposed between the epitaxial source/drain regions 84 and the source/drain contacts 110. Further, the voids 104 may not be filled by the metal-semiconductor alloy regions 106 and/or the source/drain contacts 110, and only portions 54B of the CESL 54 are in the voids 104. In other words, the voids 104 expose surfaces of the CESL 54 and the epitaxial source/drain regions 84, but do not expose surfaces of the metal-semiconductor alloy regions 106 or the source/drain contacts 110.

Figures 15A, 15B:
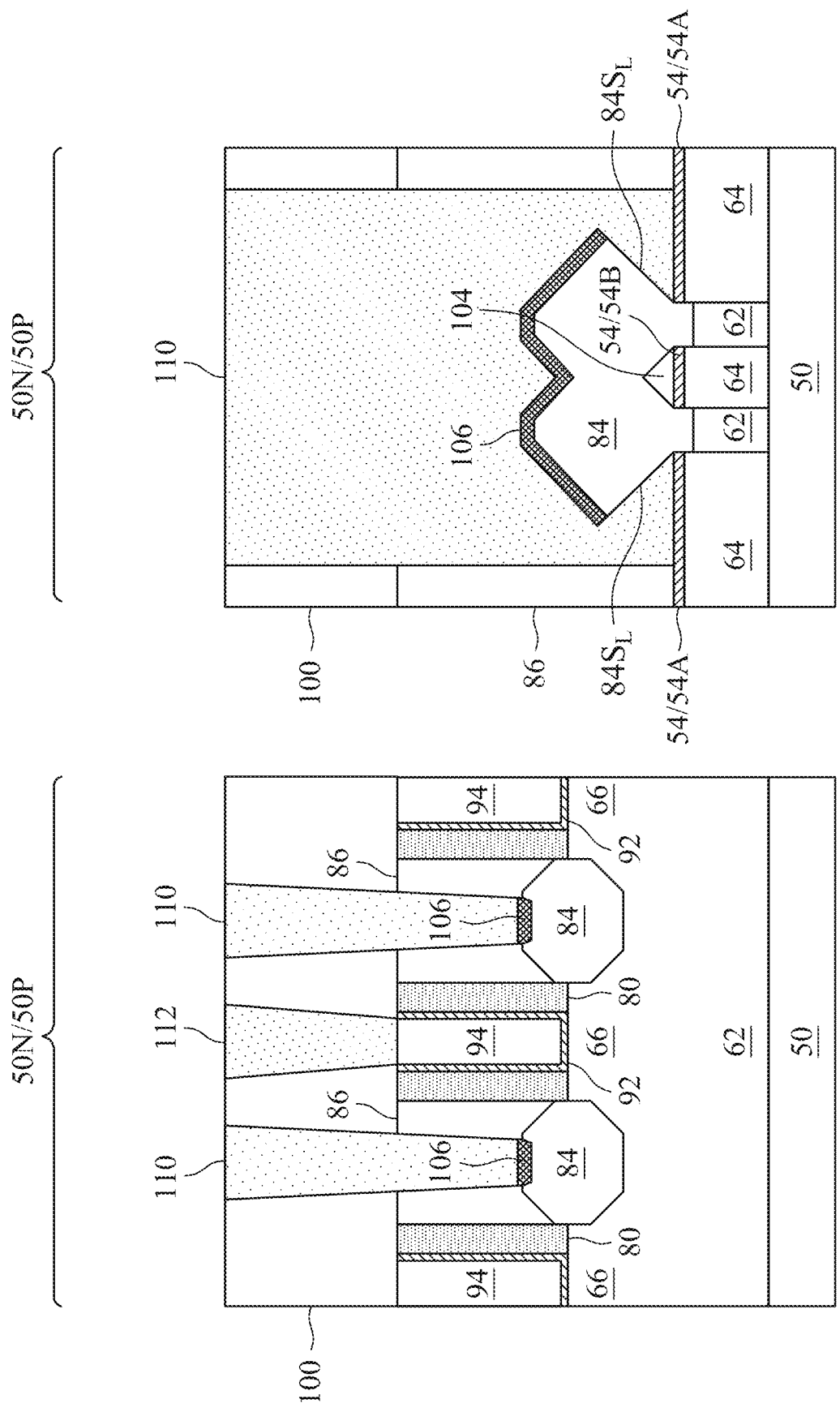

In FIGS. 15A and 15B, gate contacts 112 are formed through the second ILD layer 100. Openings for the gate contacts 112 are formed through the second ILD layer 100. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 100. The remaining liner and conductive material form the gate contacts 112 in the openings. The gate contacts 112 are physically and electrically coupled to, and thus are connected to the gate electrodes 94. The gate contacts 112 can penetrate through gate masks (if present) over the gate electrodes 94. After formation, top surfaces of the second ILD layer 100, the source/drain contacts 110, and the gate contacts 112 are coplanar.

Other processes and sequences may be used to form the gate contacts 112. For example, the source/drain contacts 110 and the gate contacts 112 may be formed in different processes, or may be formed in the same process. In some embodiments, the gate contacts 112 are formed simultaneously with the source/drain contacts 110, e.g., the openings for the gate contacts 112 are formed concurrently with the openings for the source/drain contacts 110. Further, although the source/drain contacts 110 and the gate contacts 112 are illustrated in a same cross-section, each of the source/drain contacts 110 and the gate contacts 112 may be formed in different cross-sections, which may avoid shorting of the contacts.

FIGS. 16A and 16B are cross-sectional views of FinFETs, in accordance with some other embodiments. This embodiment is similar to the embodiment described with respect to FIGS. 15A and 15B, except the source/drain contacts 110 include separate lower source/drain contacts 110A and upper source/drain contacts 110B. The lower source/drain contacts 110A extend through the first ILD layer 86 and the upper source/drain contacts 110B extend through the second ILD layer 100. The lower source/drain contacts 110A are thus disposed between the upper source/drain contacts 110B and the metal-semiconductor alloy regions 106.

As an example to form the lower source/drain contacts 110A, before forming the second ILD layer 100, openings for the lower source/drain contacts 110A can be formed through the first ILD layer 86. The openings may be formed using similar processes as those discussed with respect to FIGS. 12A through 12D. The metal-semiconductor alloy regions 106 and the lower source/drain contacts 110A are then formed in the openings using a similar process as that discussed with respect to FIGS. 13A through 14B. After formation, top surfaces of the gate spacers 80, the first ILD layer 86, the gate electrodes 94, and the lower source/drain contacts 110A are coplanar.

As an example to form the upper source/drain contacts 110B, after forming the second ILD layer 100, openings for the upper source/drain contacts 110B are formed through the second ILD layer 100. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 100. The remaining liner and conductive material form the upper source/drain contacts 110B in the openings. The upper source/drain contacts 110B are connected to the lower source/drain contacts 110A, and the lower source/drain contacts 110A are connected to the epitaxial source/drain regions 84. The upper source/drain contacts 110B and the gate contacts 112 may be formed in different processes, or may be formed in the same process. After formation, the top surfaces of the second ILD layer 100, the upper source/drain contacts 110B, and the gate contacts 112 are coplanar.

It should be appreciated that some embodiments may combine features from the embodiments illustrated in FIGS. 15A through 16B. For example, source/drain contacts in a first region of a die (e.g., an input/output region) can be continuous conductive features that extend through multiple ILD layers (as shown in FIGS. 15A and 15B), while source/drain contacts in a second region of the die (e.g., a core logic region) can have separate upper and lower conductive features in respective ILD layers (as shown in FIGS. 16A and 16B).

Figure 17B:
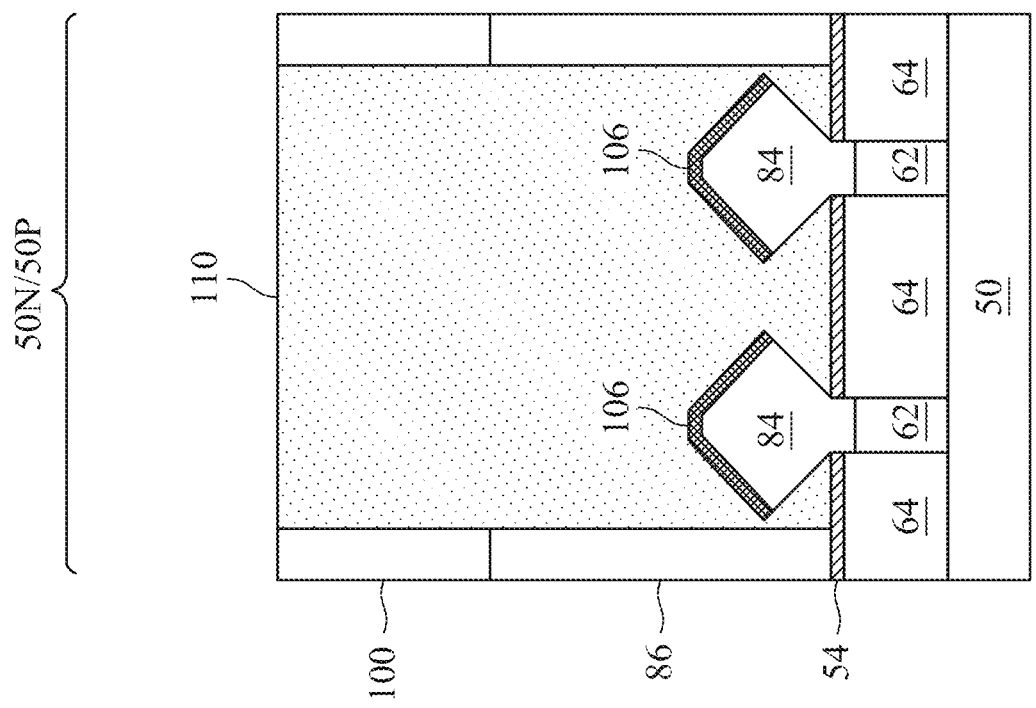
FIGS. 17A and 17B are cross-sectional views of FinFETs, in accordance with some other embodiments.
Figure 17A:
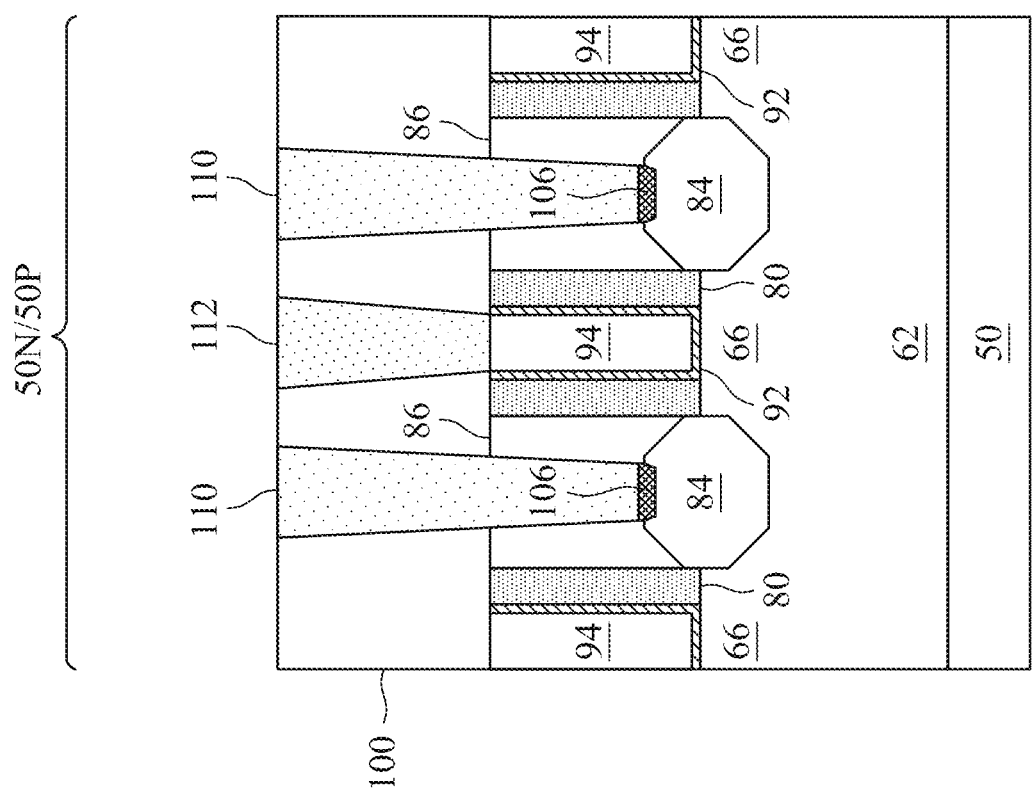

FIGS. 17A and 17B are cross-sectional views of FinFETs, in accordance with some other embodiments. This embodiment is similar to the embodiment described with respect to FIGS. 15A and 15B, except adjacent epitaxial source/drain regions 84 remain separated after they are epitaxially grown. In this embodiment, a same source/drain contact 110 is used to connect the adjacent epitaxial source/drain regions 84.

Figure 18A:
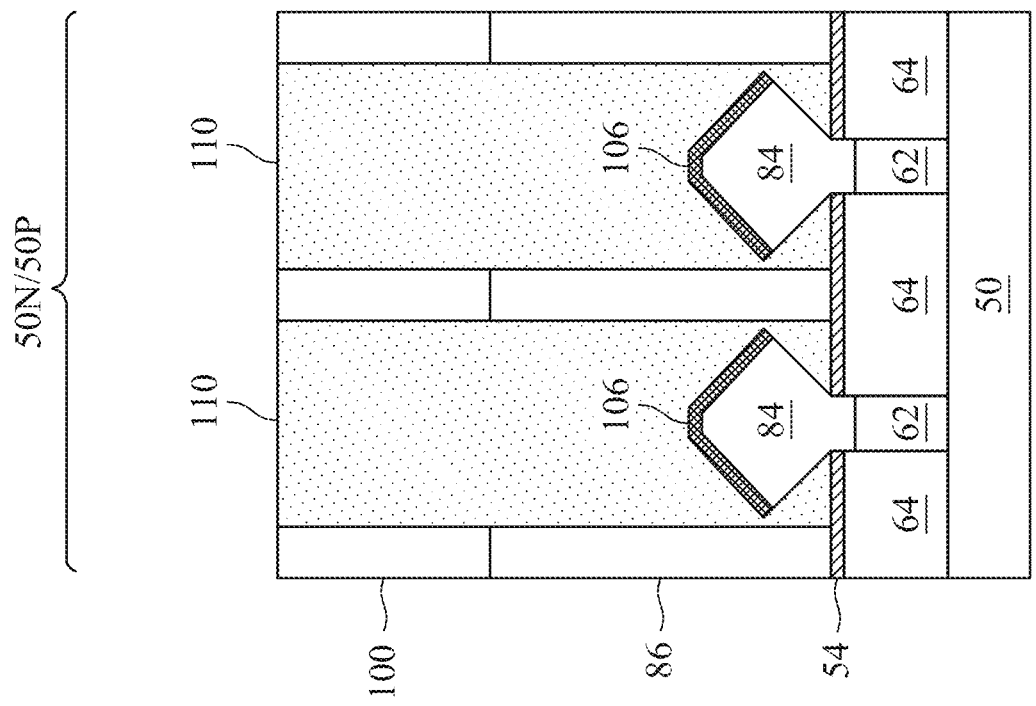
FIGS. 18A and 18B are cross-sectional views of FinFETs, in accordance with some other embodiments.
Figure 18B:
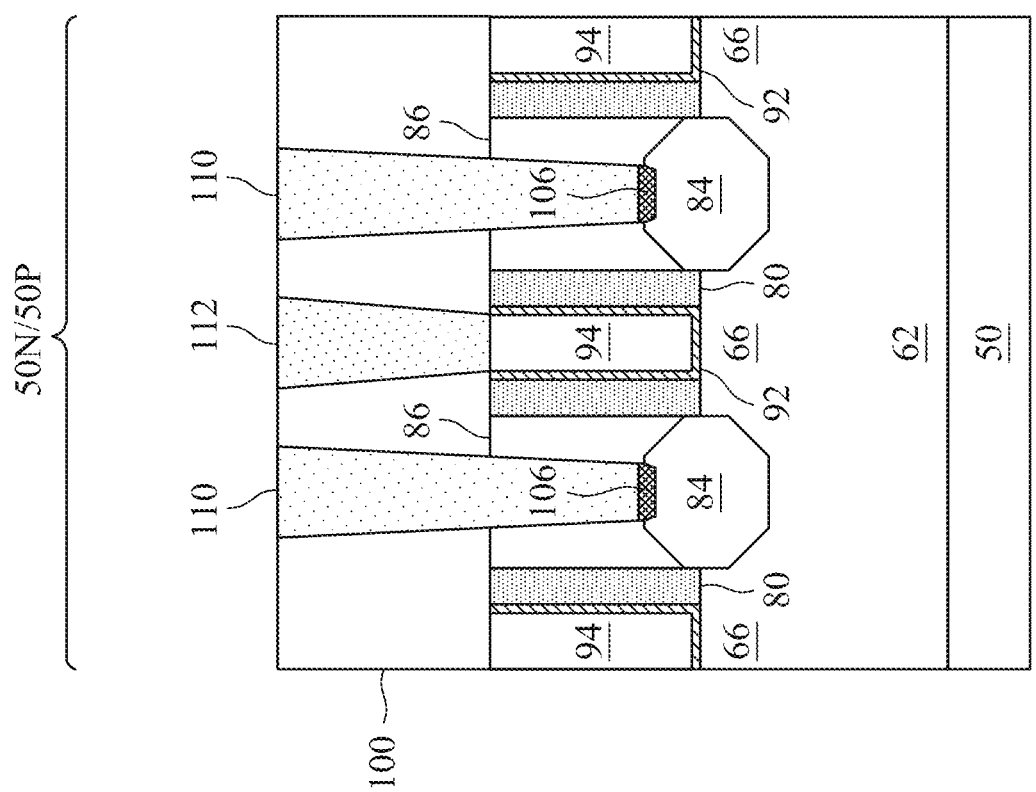

FIGS. 18A and 18B are cross-sectional views of FinFETs, in accordance with some other embodiments. This embodiment is similar to the embodiment described with respect to FIGS. 17A and 17B, except adjacent epitaxial source/drain regions 84 remain separated and are not connected by a same source/drain contact. Rather, each respective epitaxial source/drain regions 84 is connected to a respective source/drain contact 110.

Figure 19:
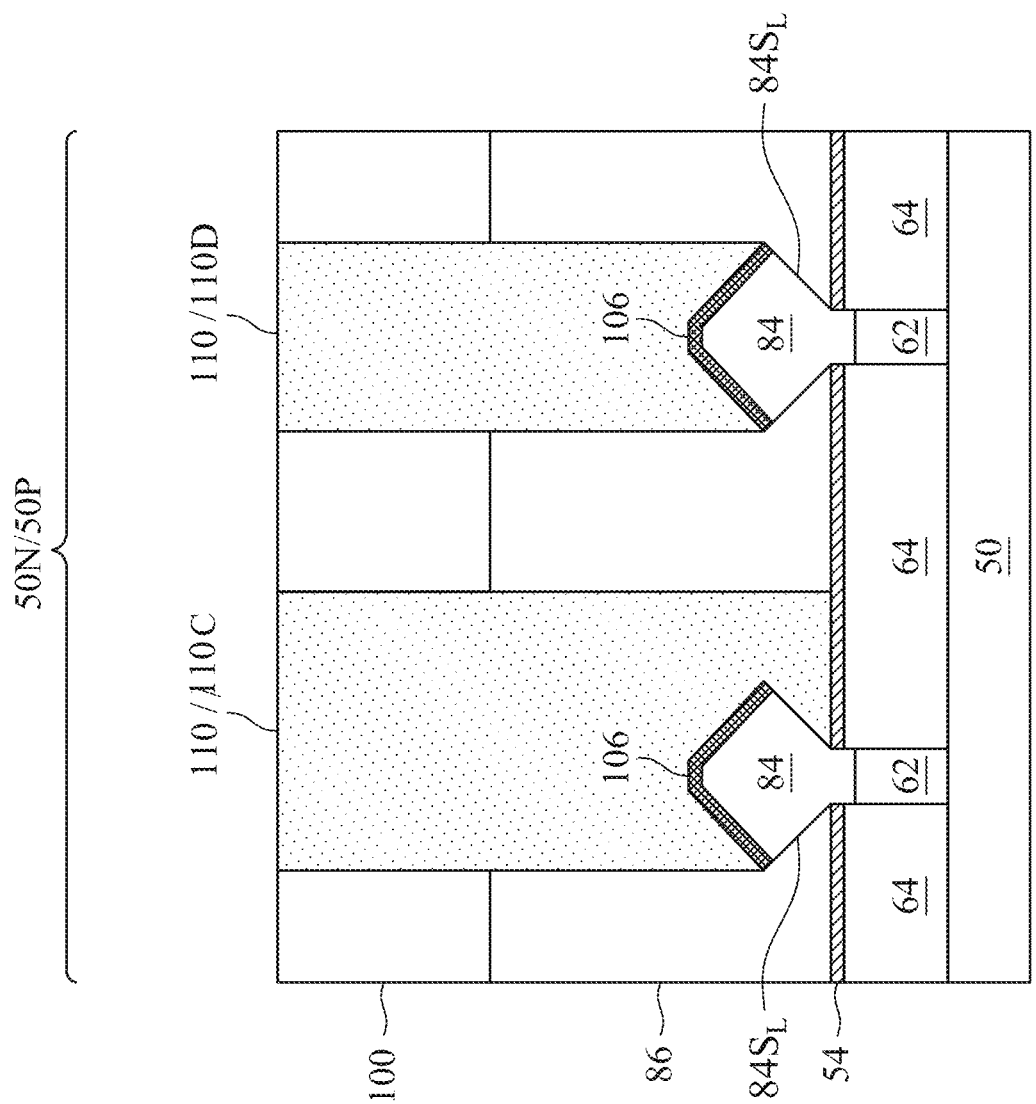
FIG. 19 is a cross-sectional view of FinFETs, in accordance with some other embodiments.

FIG. 19 is a cross-sectional view of FinFETs, in accordance with some other embodiments. This embodiment is similar to the embodiment described with respect to FIG. 18B, except multiple shapes of source/drain contacts 110 are used. For example, a first source/drain contact 110C can contact some, but not all of the lower facets $84S_L$ of the epitaxial source/drain regions 84, with the other lower facets $84S_L$ of the epitaxial source/drain regions 84 contacting the first ILD layer 86. Further, a second source/drain contact 110D can contact none of the lower facets $84S_L$ of the epitaxial source/drain regions 84. FIG. 19 may be indicative of embodiments where some material of the first ILD layer 86 remains beneath the epitaxial source/drain regions 84, but the quantity of exposed facets $84S_U$, $84S_L$ is nevertheless increased.

Figure 20:
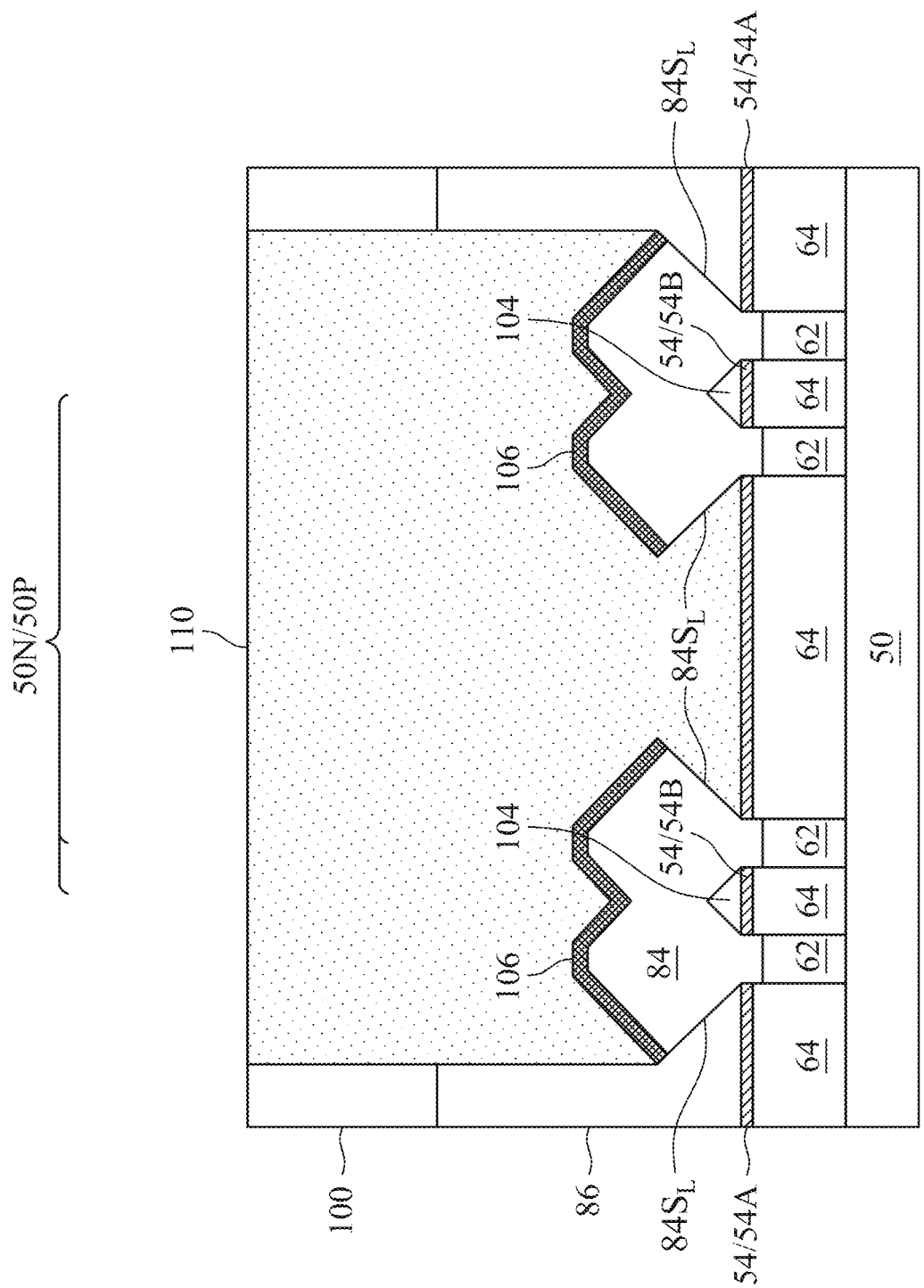
FIG. 20 is a cross-sectional view of FinFETs, in accordance with some other embodiments.

FIG. 20 is a cross-sectional view of FinFETs, in accordance with some other embodiments. This embodiment is similar to the embodiment described with respect to FIG. 15B, except a same source/drain contact 110 is used to connect multiple merged epitaxial source/drain regions 84. Further, the source/drain contact 110 can contact some, but not all of the lower facets $84S_L$ of the epitaxial source/drain regions 84, with the other lower facets $84S_L$ of the epitaxial source/drain regions 84 contacting the first ILD layer 86. FIG. 20 may be indicative of embodiments where some material of the first ILD layer 86 remains beneath the epitaxial source/drain regions 84, but the quantity of exposed facets $84S_U$, $84S_L$ is nevertheless increased.

Figure 21B:
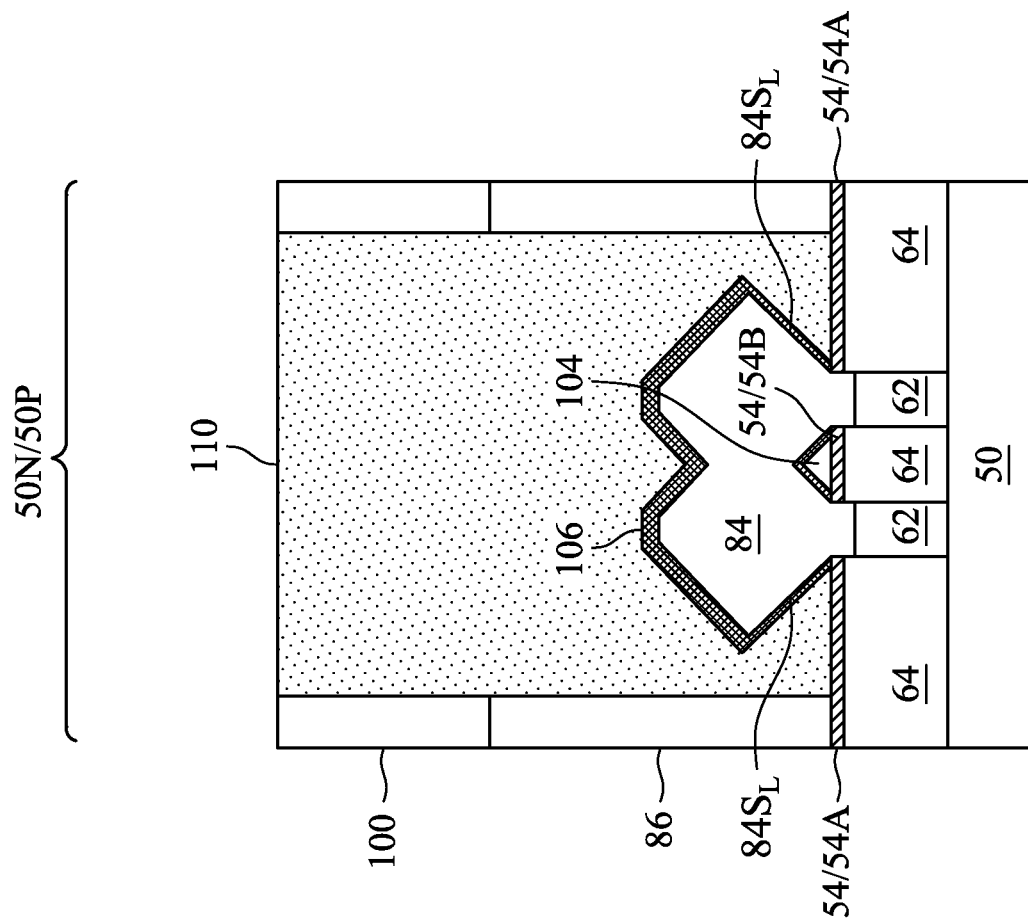
FIGS. 21A and 21B are cross-sectional views of FinFETs, in accordance with some other embodiments.
Figure 21A:
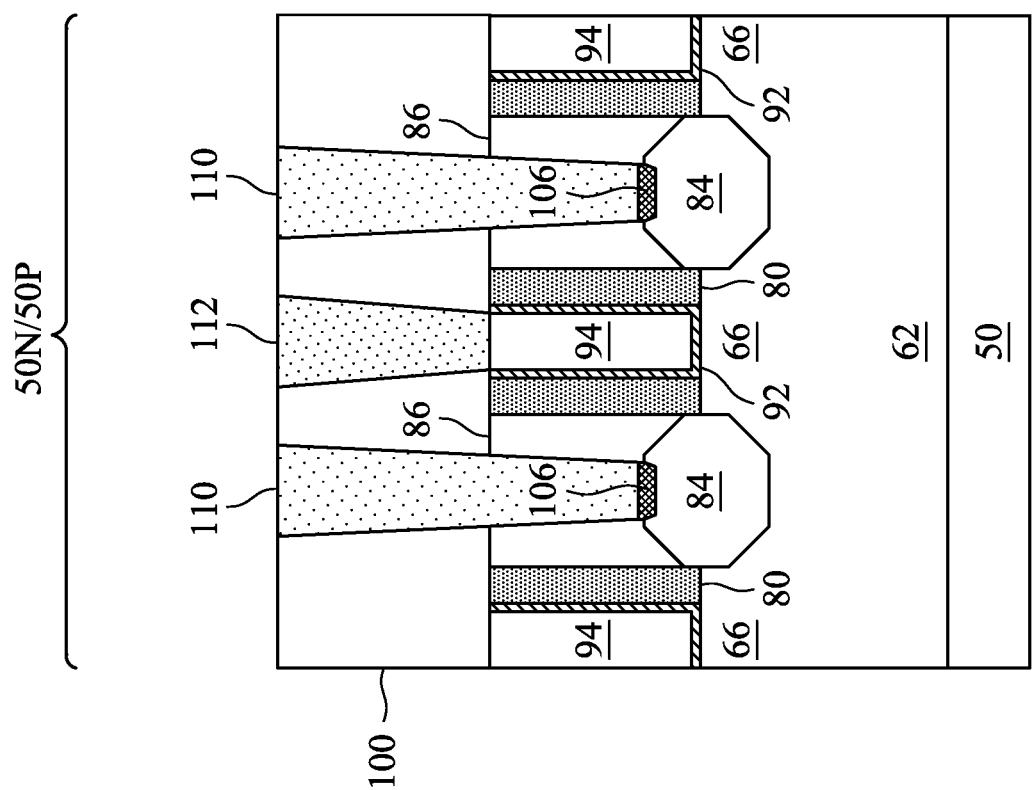

FIGS. 21A and 21B are cross-sectional views of FinFETs, in accordance with some other embodiments. This embodiment is similar to the embodiment described with respect to FIGS. 15A and 15B, except the metal-semiconductor alloy regions 106 are formed on the upper facets $84S_U$ and the lower facets $84S_L$ of the epitaxial source/drain regions 84. In this embodiment, the metal for the metal-semiconductor alloy regions 106 is deposited by a blanket deposition process, such as CVD or ALD. In some embodiments, the metal-semiconductor alloy regions 106 have a uniform thickness. In some embodiments, the portions of the metal-semiconductor alloy regions 106 on the upper facets $84S_U$ are thicker than the portions of the metal-semiconductor alloy regions 106 on the lower facets $84S_L$. For example, when depositing the metal for the metal-semiconductor alloy regions 106 by CVD or ALD, crowding beneath the epitaxial source/drain regions 84 may decrease or impede the precursor diffusion beneath the epitaxial source/drain regions 84. Further in this embodiment, the voids 104 may (or may not) be partially filled by the metal-semiconductor alloy regions 106. As such, the portions of the metal-semiconductor alloy regions 106 in the voids 104 can also be thinner than the portions of the metal-semiconductor alloy regions 106 on the upper facets $84S_U$.

Embodiments may achieve advantages. Because the CESL 54 underlies the raised portions of the epitaxial source/drain regions 84, the ILD layers 86, 100 may be over-etched without damaging the STI regions 64, allowing for the removal of portions 86R, 86B (see FIG. 12C) of the first ILD layer 86 beneath the epitaxial source/drain regions 84. Removing the portions 86R, 86B of the first ILD layer 86 beneath the epitaxial source/drain regions 84 allows the lower facets $84S_L$ of the epitaxial source/drain regions 84 to be exposed by the source/drain contact openings 102. Exposing more surfaces of the epitaxial source/drain regions 84 allows the metal-semiconductor alloy regions 106 and the source/drain contacts 110 to contact a greater surface area of the epitaxial source/drain regions 84. Increasing the contact surface area can help reduce the contact resistance to the epitaxial source/drain regions 84, particularly when the resulting FinFETs are formed at a small technology node. Further, by reducing the amount of dielectric material around the epitaxial source/drain regions 84, the parasitic capacitance between the gate electrodes 94 and the source/drain contacts 110 can be reduced. The performance of the FinFETs may thus be improved.

In an embodiment, a method includes: etching a source/drain recess in a fin, the source/drain recess extending through a contact etch stop layer (CESL); growing an epitaxial source/drain region in the source/drain recess; depositing an inter-layer dielectric (ILD) layer on the epitaxial source/drain region and the CESL; etching an opening through the ILD layer with an isotropic etch, the isotropic etch removing portions of the ILD layer beneath the epitaxial source/drain region to expose the CESL and lower facets of the epitaxial source/drain region; and forming a source/drain contact in the opening, the source/drain contact extending along the lower facets of the epitaxial source/drain region.

In some embodiments, the method further includes, before etching the source/drain recess in the fin: depositing a first dielectric layer on a substrate; depositing the CESL on the first dielectric layer; depositing a second dielectric layer on the CESL; etching a trench in the second dielectric layer, the CESL, and the first dielectric layer; growing the fin in the trench; and removing the second dielectric layer. In some embodiments of the method, the etching the opening through the ILD layer includes: performing an anisotropic etch to form the opening, the opening exposing upper facets of the epitaxial source/drain region after the anisotropic etch, the lower facets of the epitaxial source/drain region remaining covered after the anisotropic etch; and performing the isotropic etch to expand the opening, the opening exposing the lower facets of the epitaxial source/drain region after the isotropic etch. In some embodiments of the method, the ILD layer includes silicon oxide; the CESL includes silicon nitride; the anisotropic etch is a dry etch performed with tetrafluoromethane, hexafluoro-1,3-butadiene, octafluorocyclobutane, or octafluorocyclopentene; and the isotropic etch is a wet etch performed with dilute hydrofluoric acid, hydrogen fluoride and ammonia, or nitrogen trifluoride and ammonia. In some embodiments of the method, the ILD layer includes silicon oxide; the CESL includes silicon nitride; the anisotropic etch is a first dry etch performed with tetrafluoromethane, hexafluoro-1,3-butadiene, octafluorocyclobutane, or octafluorocyclopentene; the isotropic etch is a second dry etch performed with tetrafluoromethane, hexafluoro-1,3-butadiene, octafluorocyclobutane, or octafluorocyclopentene; and the second dry etch is performed at a greater pressure and with a lower bias voltage than the first dry etch. In some embodiments of the method, the isotropic etch is performed for a duration in a range of 5 seconds to 60 seconds. In some embodiments of the method, performing the isotropic etch widens the opening by 5% to 50%. In some embodiments, the method further includes: forming a silicide on upper facets of the epitaxial source/drain region, the source/drain contact contacting the silicide and a subset of the lower facets of the epitaxial source/drain region. In some embodiments of the method, the ILD layer physically contacts the epitaxial source/drain region before etching the opening. In some embodiments of the method, after forming the source/drain contact, a void remains beneath the epitaxial source/drain region, the void exposing a portion of the CESL.

In an embodiment, a structure includes: an isolation region on a substrate; a contact etch stop layer (CESL) on the isolation region; a first fin extending through the CESL and the isolation region; a second fin extending through the CESL and the isolation region; an epitaxial source/drain region in the first fin and the second fin, the epitaxial source/drain region disposed over a first portion of the CESL, the first portion of the CESL laterally disposed between the first fin and the second fin; an inter-layer dielectric (ILD) layer on the epitaxial source/drain region and a second portion of the CESL; and a source/drain contact extending through the ILD layer, the source/drain contact contacting the second portion of the CESL and lower facets of the epitaxial source/drain region.

In some embodiments, the structure further includes: a silicide on upper facets of the epitaxial source/drain region, the source/drain contact contacting the silicide. In some embodiments, the structure further includes: a void beneath the epitaxial source/drain region, the void exposing the first portion of the CESL and a subset of the lower facets of the epitaxial source/drain region. In some embodiments of the structure, interfaces of the CESL and the source/drain contact are parallel to a major surface of the substrate. In some embodiments of the structure, the lower facets of the epitaxial source/drain region are free from the CESL. In some embodiments of the structure, the lower facets of the epitaxial source/drain region are free from the ILD layer. In some embodiments of the structure, the ILD layer includes silicon oxide and the CESL includes silicon nitride. In some embodiments of the structure, the first fin and the second fin are each epitaxial structures disposed on the substrate. In some embodiments, the structure further includes: a gate structure on the first fin and the second fin, the gate structure contacting the first portion and the second portion of the CESL.

In an embodiment, a structure includes: a contact etch stop layer (CESL) over a substrate; a fin extending through the CESL; an epitaxial source/drain region in the fin, the epitaxial source/drain region extending through the CESL; a silicide contacting upper facets of the epitaxial source/drain region; a source/drain contact contacting the silicide, lower facets of the epitaxial source/drain region, and a first surface of the CESL; and an inter-layer dielectric (ILD) layer surrounding the source/drain contact, the ILD layer contacting the first surface of the CESL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a contact etch stop layer (CESL) on a first dielectric layer;
   depositing a second dielectric layer on the CESL;
   etching a trench in the second dielectric layer, the CESL, and the first dielectric layer;
   growing a fin in the trench;
   removing the second dielectric layer;
   etching a source/drain recess in the fin, the source/drain recess extending through the CESL;
   growing an epitaxial source/drain region in the source/drain recess;
   depositing an inter-layer dielectric (ILD) layer on the epitaxial source/drain region and the CESL;
   etching an opening through the ILD layer with an isotropic etch, the isotropic etch removing portions of the ILD layer beneath the epitaxial source/drain region to expose the CESL and lower facets of the epitaxial source/drain region; and
   forming a source/drain contact in the opening, the source/drain contact extending along the lower facets of the epitaxial source/drain region.

2. The method of claim 1, wherein the etching the opening through the ILD layer comprises:
   performing an anisotropic etch to form the opening, the opening exposing upper facets of the epitaxial source/drain region after the anisotropic etch, the lower facets of the epitaxial source/drain region remaining covered after the anisotropic etch; and
   performing the isotropic etch to expand the opening, the opening exposing the lower facets of the epitaxial source/drain region after the isotropic etch.

3. The method of claim 2, wherein the ILD layer comprises silicon oxide; the CESL comprises silicon nitride; the anisotropic etch is a dry etch performed with tetrafluoromethane, hexafluoro-1,3-butadiene, octafluorocyclobutane, or octafluorocyclopentene; and the isotropic etch is a wet etch performed with dilute hydrofluoric acid, hydrogen fluoride and ammonia, or nitrogen trifluoride and ammonia.

4. The method of claim 2, wherein the ILD layer comprises silicon oxide; the CESL comprises silicon nitride; the anisotropic etch is a first dry etch performed with tetrafluoromethane, hexafluoro-1,3-butadiene, octafluorocyclobutane, or octafluorocyclopentene; the isotropic etch is a second dry etch performed with tetrafluoromethane, hexafluoro-1,3-butadiene, octafluorocyclobutane, or octafluorocyclopentene; and the second dry etch is performed at a greater pressure and with a lower bias voltage than the first dry etch.

5. The method of claim 2, wherein the isotropic etch is performed for a duration in a range of 5 seconds to 60 seconds.

6. The method of claim 2, wherein performing the isotropic etch widens the opening by 5% to 50%.

7. The method of claim 1 further comprising:
forming a metal-semiconductor alloy region on upper facets of the epitaxial source/drain region, the source/drain contact contacting the metal-semiconductor alloy region and a subset of the lower facets of the epitaxial source/drain region.

8. The method of claim 1, wherein the ILD layer physically contacts the epitaxial source/drain region before etching the opening.

9. The method of claim 1, wherein after forming the source/drain contact, a void remains beneath the epitaxial source/drain region, the void exposing a portion of the CESL.

10. A method comprising:
depositing a contact etch stop layer (CESL) on a dielectric layer;
after depositing the CESL, forming a fin protruding above the CESL;
etching a source/drain recess in the fin, the source/drain recess extending beneath a top surface of the CESL and beneath a top surface of the dielectric layer;
growing an epitaxial source/drain region in the source/drain recess;
depositing an inter-layer dielectric (ILD) on the epitaxial source/drain region and the CESL;
etching an opening through the ILD, the opening exposing an upper surface of the epitaxial source/drain region, a lower surface of the epitaxial source/drain region, and the top surface of the CESL; and
forming a contact in the opening, the contact connected to the epitaxial source/drain region.

11. The method of claim 10, wherein etching the opening through the ILD comprises:
etching the ILD with a first etching process to expose the upper surface of the epitaxial source/drain region and a first portion of the top surface of the CESL; and
etching the ILD with a second etching process to expose the lower surface of the epitaxial source/drain region and a second portion of the top surface of the CESL, the second etching process different from the first etching process.

12. The method of claim 11, wherein the second etching process has a greater degree of isotropy than the first etching process.

13. The method of claim 11, wherein the second etching process widens the opening.

14. The method of claim 10 further comprising:
forming a metal-semiconductor alloy region on the upper surface of the epitaxial source/drain region, the contact contacting the metal-semiconductor alloy region and the lower surface of the epitaxial source/drain region.

15. A method comprising:
etching a trench in a contact etch stop layer (CESL) and a first dielectric layer, the CESL formed on the first dielectric layer;
growing a fin in the trench;
etching a source/drain recess in the fin, the source/drain recess extending through the CESL;
growing an epitaxial source/drain region in the source/drain recess, the CESL underlying the epitaxial source/drain region so that lower facets and upper facets of the epitaxial source/drain region are free from the CESL;
depositing an inter-layer dielectric (ILD) on the epitaxial source/drain region and the CESL;
etching an opening through the ILD to expose the upper facets of the epitaxial source/drain region, the lower facets of the epitaxial source/drain region, and the CESL; and
forming a contact in the opening, the contact connected to the epitaxial source/drain region.

16. The method of claim 15, wherein etching the opening through the ILD comprises:
etching the ILD with an anisotropic etching process to expose the upper facets of the epitaxial source/drain region; and
etching the ILD with an isotropic etching process to expose the lower facets of the epitaxial source/drain region.

17. The method of claim 15, wherein etching the opening through the ILD comprises:
etching the ILD with a first anisotropic etching process to expose the upper facets of the epitaxial source/drain region; and
etching the ILD with a second anisotropic etching process to expose the lower facets of the epitaxial source/drain region.

18. The method of claim 15 further comprising:
forming a metal-semiconductor alloy region on the upper facets of the epitaxial source/drain region, the contact contacting the metal-semiconductor alloy region and the lower facets of the epitaxial source/drain region.

19. The method of claim 15, wherein the ILD physically contacts the epitaxial source/drain region before etching the opening.

20. The method of claim 15, wherein after forming the contact, a void remains beneath the epitaxial source/drain region, the void exposing a portion of the CESL.

* * * * *